(12) United States Patent
Bocock et al.

(10) Patent No.: US 12,104,776 B2
(45) Date of Patent: *Oct. 1, 2024

(54) WIRELESS CONTROLLABLE LIGHTING DEVICE

(71) Applicant: Lutron Technology Company LLC, Coopersburg, PA (US)

(72) Inventors: Ryan M. Bocock, Austin, TX (US); Robert Bollinger, Jr., Fogelsville, PA (US); Richard S. Camden, Coopersburg, PA (US); Kevin L. Gascho, Bethlehem, PA (US); Robert C. Newman, Jr., Emmaus, PA (US); Peter W. Ogden, Jr., Austin, TX (US)

(73) Assignee: Lutron Technology Company LLC, Coopersburg, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/228,871

(22) Filed: Aug. 1, 2023

(65) Prior Publication Data
US 2023/0375171 A1 Nov. 23, 2023

Related U.S. Application Data

(60) Continuation of application No. 17/726,031, filed on Apr. 21, 2022, now Pat. No. 11,725,809, which is a
(Continued)

(51) Int. Cl.
*F21V 29/71* (2015.01)
*F21V 7/06* (2006.01)
(Continued)

(52) U.S. Cl.
CPC .............. *F21V 29/713* (2015.01); *F21V 7/06* (2013.01); *H05K 1/0204* (2013.01); *F21Y 2115/10* (2016.08); *H05K 2201/10106* (2013.01)

(58) Field of Classification Search
CPC ....... H05K 2201/10106; F21Y 2115/10; F21V 29/70; F21V 29/71; F21V 29/713;
(Continued)

(56) References Cited

U.S. PATENT DOCUMENTS 9,155,172 B2 10/2015 Baragona et al.
9,332,598 B1 5/2016 Ho et al.
(Continued)

FOREIGN PATENT DOCUMENTS

EP 1108612 A2 6/2001
WO 2014140961 A1 9/2014
WO 2018215481 A1 11/2018

*Primary Examiner* — Robert J May
(74) *Attorney, Agent, or Firm* — Flaster Greenberg P.C.

(57) ABSTRACT

A lighting device (e.g., a controllable light-emitting diode illumination device) may have a light-generation module that may be assembled and calibrated prior to the light-generation module being installed in a finished good. The light-generation module may include an emitter module having at least one emitter mounted to a substrate and configured to emit light. The light-generation module may include a first printed circuit board on which the emitter module may be mounted and a second printed circuit board on which those circuits that are essential for powering the emitter module may be mounted. The light-generation module may include a heat sink located between the first printed circuit board and the second printed circuit board. The emitter module may be thermally-coupled to the heat sink through the substrate and the first printed circuit board.

19 Claims, 19 Drawing Sheets

Related U.S. Application Data division of application No. 17/142,789, filed on Jan. 6, 2021, now Pat. No. 11,333,343, which is a continuation of application No. 16/839,779, filed on Apr. 3, 2020, now Pat. No. 10,935,228.

(60) Provisional application No. 63/000,613, filed on Mar. 27, 2020, provisional application No. 62/879,159, filed on Jul. 26, 2019, provisional application No. 62/828,791, filed on Apr. 3, 2019.

(51) Int. Cl.
*H05K 1/02* (2006.01)
*F21Y 115/10* (2016.01)

(58) Field of Classification Search
CPC ...... F21V 29/717; F21V 29/773; F21V 29/74; F21V 29/745; F21V 29/75; F21V 29/76; F21V 29/763; F21V 29/767; F21V 29/78
See application file for complete search history.

(56) References Cited

U.S. PATENT DOCUMENTS

| | | |
|---|---|---|
| 9,392,660 B2 | 7/2016 | Dias et al. |
| 9,392,663 B2 | 7/2016 | Knapp et al. |
| 9,485,813 B1 | 11/2016 | Lewis et al. |
| 9,538,623 B2 | 1/2017 | Lee et al. |
| 9,538,632 B2 | 1/2017 | Reid et al. |
| 9,736,895 B1 | 8/2017 | Dong et al. |
| 9,769,899 B2 | 9/2017 | Ho et al. |
| 9,777,915 B2 | 10/2017 | Johnson |
| 10,125,960 B2 | 11/2018 | Klafta et al. |
| 2015/0103515 A1 | 4/2015 | Bosua et al. |
| 2015/0285441 A1 | 10/2015 | Chou et al. |
| 2016/0205752 A1 | 7/2016 | Chung |
| 2018/0215481 A1 | 8/2018 | Sure et al. |

WIRELESS CONTROLLABLE LIGHTING DEVICE

CROSS-REFERENCE TO RELATED APPLICATIONS

This application is a continuation of U.S. Non-Provisional patent application Ser. No. 17/726,031, filed Apr. 21, 2022, which is a divisional of U.S. Non-Provisional patent application Ser. No. 17/142,789, filed Jan. 6, 2021, which is a continuation of U.S. Non-Provisional patent application Ser. No. 16/839,779, filed Apr. 3, 2020, which claims the benefit of Provisional U.S. Patent Application No. 62/828,791, filed Apr. 3, 2019; Provisional U.S. Patent Application No. 62/879,159, filed Jul. 26, 2019, and Provisional U.S. Patent Application No. 63/000,613, filed Mar. 27, 2020, the disclosures of which are incorporated herein by reference in their entirety.

BACKGROUND

Lamps and displays using efficient light sources, such as light-emitting diodes (LED) light sources, for illumination are becoming increasingly popular in many different markets. LED light sources provide a number of advantages over traditional light sources, such as incandescent and fluorescent lamps. For example, LED light sources may have a lower power consumption and a longer lifetime than traditional light sources. In addition, the LED light sources may have no hazardous materials, and may provide additional specific advantages for different applications. When used for general illumination, LED light sources provide the opportunity to adjust the color (e.g., from white, to blue, to green, etc.) or the color temperature (e.g., from warm white to cool white) of the light emitted from the LED light sources to produce different lighting effects.

A multi-colored LED illumination device may have two or more different colors of LED emission devices (e.g., LED emitters) that are combined within the same package to produce light (e.g., white or near-white light). There are many different types of white light LED light sources on the market, some of which combine red, green, and blue (RGB) LED emitters; red, green, blue, and yellow (RGBY) LED emitters; phosphor-converted white and red (WR) LED emitters; red, green, blue, and white (RGBW) LED emitters, etc. By combining different colors of LED emitters within the same package, and driving the differently-colored emitters with different drive currents, these multi-colored LED illumination devices may generate white or near-white light within a wide gamut of color points or correlated color temperatures (CCTs) ranging from warm white (e.g., approximately 2600K-3700K), to neutral white (e.g., approximately 3700K-5000K) to cool white (e.g., approximately 5000K-8300K). Some multi-colored LED illumination devices also may enable the brightness (e.g., intensity or dimming level) and/or color of the illumination to be changed to a particular set point. These tunable illumination devices may all produce the same color and color rendering index (CRI) when set to a particular dimming level and chromaticity setting (e.g., color set point) on a standardized chromaticity diagram.

SUMMARY

As described herein, a lighting device (e.g., a controllable light-emitting diode illumination device) may have a light-generation module that may be assembled and calibrated prior to the light-generation module being installed in a finished good. The light-generation module may comprise an emitter module having at least one emitter mounted to a substrate and configured to emit light. The light-generation module may comprise a first printed circuit board on which the emitter module may be mounted and a second printed circuit board on which those circuits that are essential for powering the emitter module may be mounted. For example, the second printed circuit board may comprise a drive circuit for the at least one emitter of the emitter module, a control circuit for controlling the drive circuit, and a wireless communication circuit configured to communicate wireless signals. The light-generation module may also comprise a heat sink located between the first printed circuit board and the second printed circuit board. The emitter module may be thermally-coupled to the heat sink through the substrate and the first printed circuit board.

The light-generation module may comprise an insulator received in a recess in a rear surface of the heat sink. The insulator may be configured to electrically isolate the drive circuit, the control circuit, and the wireless communication circuit from the heat sink. The first printed circuit board may comprise a first connector configured to be connected to a second connector of the second printed circuit board for electrically coupling the drive circuit to the emitter. The first and second connectors may extend through openings in the heat sink and the insulator.

The lighting device may be responsive to wireless signal (e.g., radio-frequency signals). The light-generation module may comprise an antenna electrically coupled to the wireless communication circuit on the second printed circuit board. The insulator may comprise an extension that extends into a tunnel in the heat sink when the insulator is received in the recess of the heat sink. The antenna may extend through a bore in the extension of the insulator and an opening in the first printed circuit board, such that the antenna may be positioned in an emitter cavity of the lighting device. The heat sink may comprise a coupling portion configured to be capacitively coupled to a ground plane of the second printed circuit board when the second printed circuit board is located in a recess of the insulator, such that the heat sink operates as a counterpoise of the antenna. The insulator may comprise a void through when the coupling portion of the heat sink extends towards the second printed circuit board. The light-generation module may further comprise an insulating material located between the coupling portion of the heat sink and the second printed circuit board.

The lighting device may comprise a housing defining a cavity in which the light-generation module may be located. The heat sink may be thermally coupled to the housing, which may operate as an additional heat sink for the lighting device. The heat sink may define a planar front surface having a circular periphery, and a sidewall extending from the periphery of the front surface. The emitter module may be thermally coupled to the front surface of the heat sink through the substrate and the first printed circuit board. The sidewall of the heat sink may be thermally coupled to the housing. The heat sink of the light-generation module may be smaller in volume than the housing, and the heat sink may be made from a material that is more thermally conductive than a material of the housing.

DETAILED DESCRIPTION

Figure 1:
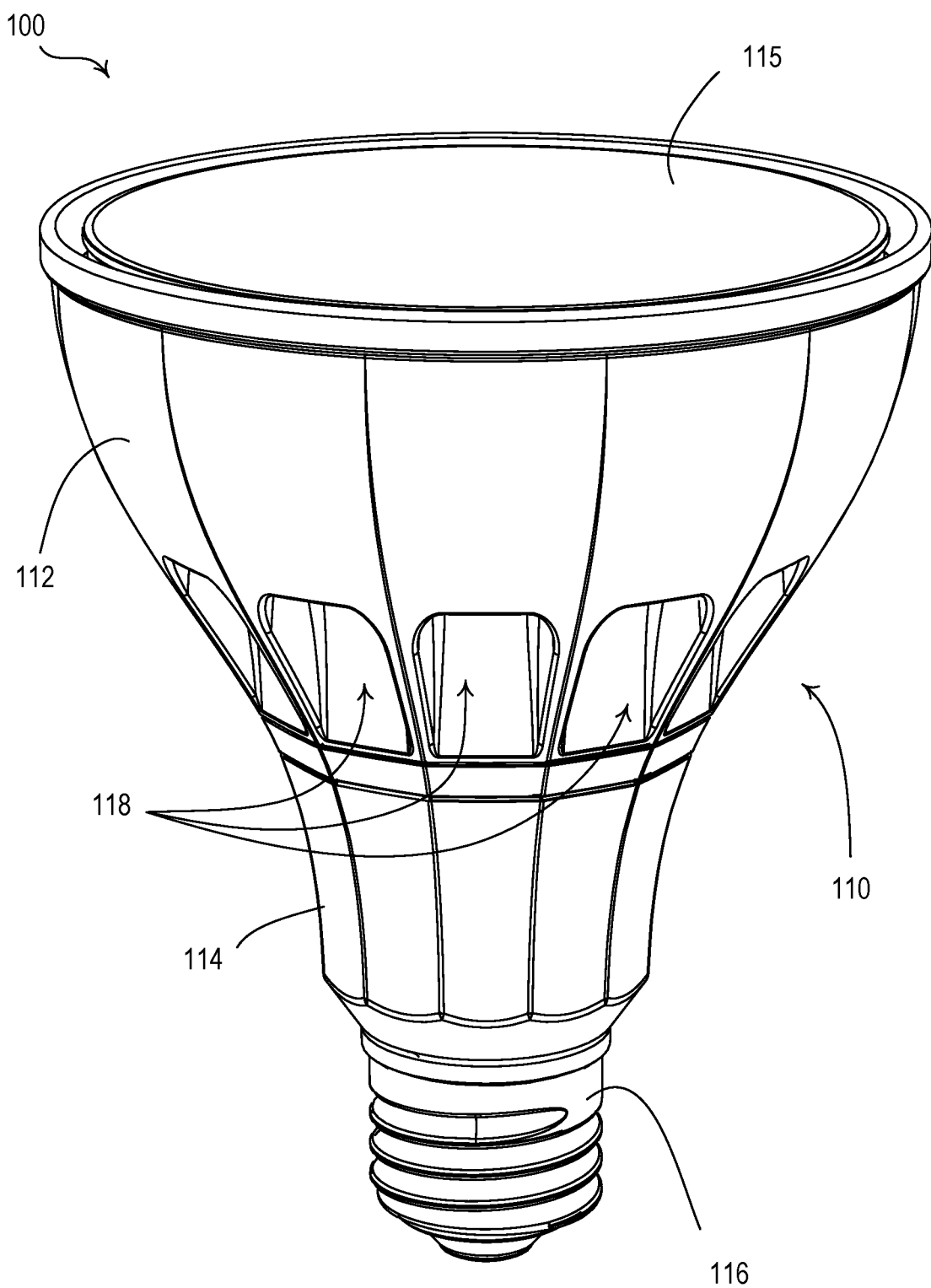
FIG. 1 is a perspective view of an example lighting device.

FIG. 1 is a perspective view of an example illumination device, such as a lighting device 100 (e.g., a controllable LED lighting device). The lighting device 100 may have a parabolic form factor and may be a parabolic aluminized reflector (PAR) lamp. The lighting device 100 may include a housing 110 (e.g., having a housing heat sink 112 and a base portion 114) and a lens 115. The lens 115 may be made of any suitable material, for example glass. The lens 115 may be transparent or translucent and may be flat or domed, for example. The lighting device 100 may include a screw-in base 116 that may be configured to be screwed into a standard Edison socket for electrically coupling the lighting device 100 to an alternating-current (AC) power source. The housing heat sink 112 may comprise vents 118 to allow for cooling of the lighting device 100 (e.g., as will be described in greater detail below).

Figure 2:
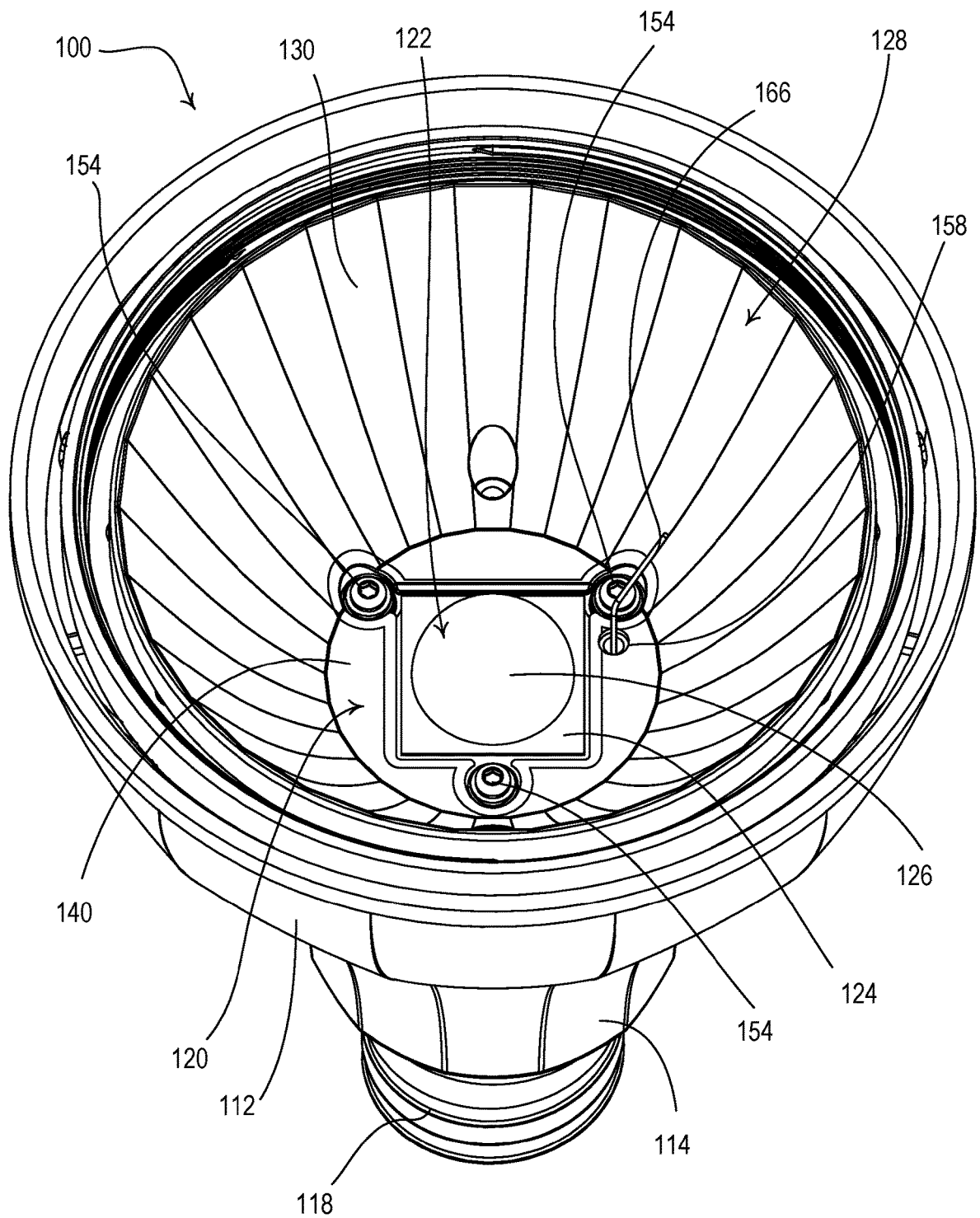
FIG. 2 is a perspective view of the lighting device of FIG. 1 with a lens removed.
Figure 3:
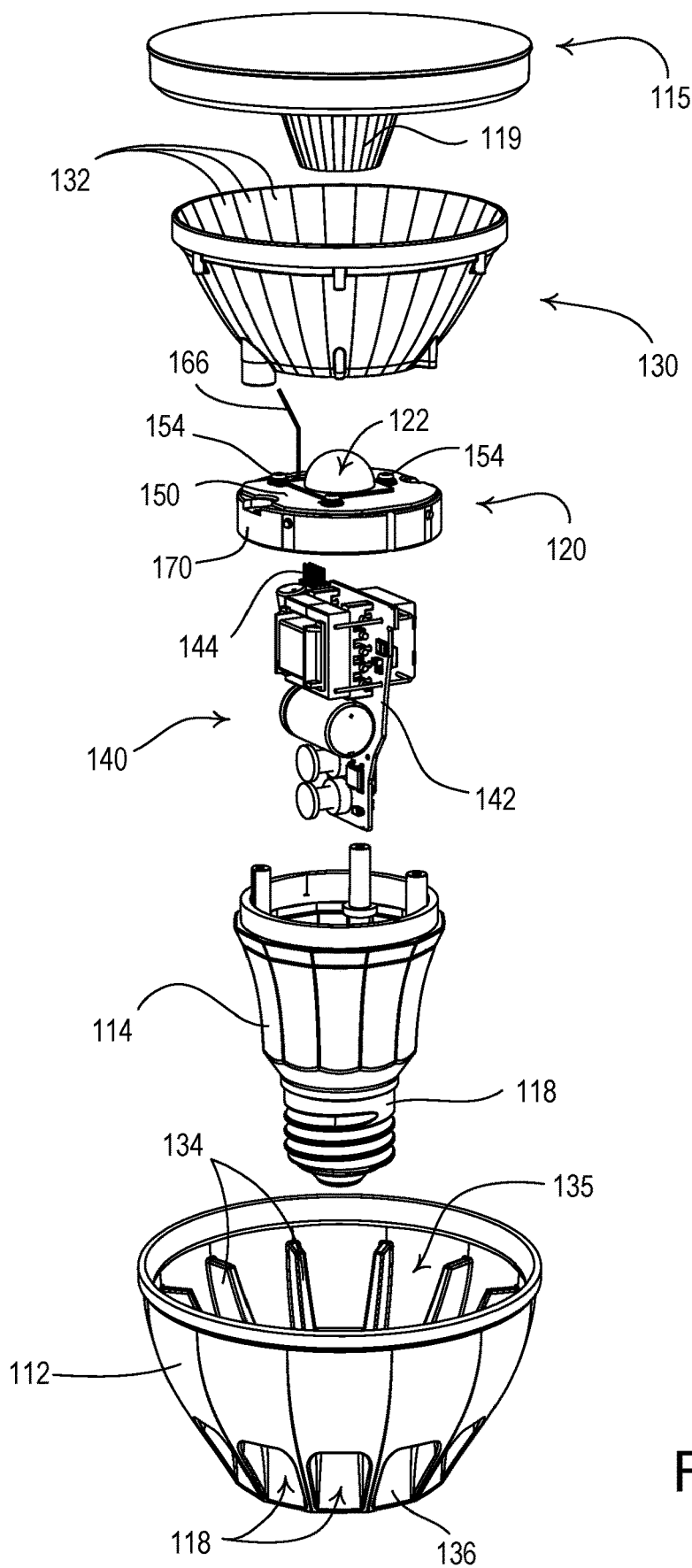
FIG. 3 is an exploded view of the lighting device of FIG. 1.

FIG. 2 is a perspective view of the lighting device 100 with the lens 115 removed. FIG. 3 is an exploded view of the lighting device 100. The lighting device 100 may comprise a light-generation module 120 that has a lighting load, such as an emitter module 122. The emitter module 122 may include one or more emitters (e.g., emission LEDs) and/or one or more detectors (e.g., detection LEDs). The emitters and detectors may be mounted on a substrate 124 and encapsulated by a primary optics structure, such as a dome 126. The substrate 124 of the emitter module 122 may be a ceramic substrate formed from an aluminum nitride or an aluminum oxide material or some other reflective material, and may function to improve output efficiency of the emitter module 122 by reflecting light out of the emitter module 122 through the dome 126. The dome 126 may comprise an optically-transmissive material, such as silicon or the like, and may be formed through an over-molding process, for example. A surface of the dome 126 may be lightly textured to increase light scattering and promote color mixing, as well as to reflect a small amount of the emitted light back toward the detectors mounted on the substrate 124 (e.g., about 5%).

The emitter module 122 may be surrounded by the housing heat sink 112 of the housing 110 in an emitter cavity 128 (e.g., an optical cavity) of the lighting device 100. The emitter cavity 128 may be defined by the lens 115, the reflector 130, and/or the carrier PCB 150. The emitter module 122 may be configured to shine light through the lens 115 (e.g., when the lens 115 is attached to the housing heat sink 112 of the housing 110). For example, light from the emitter module 122 (e.g., the emission LEDs within the emitter module 122) may be emitted through the lens 115. The lens 115 may also comprise a collector 119 (e.g., a cone-shaped collector) configured to direct the light emitted by the emitter module 122 into a beam of light. The lens 115 may comprise an array of lenslets (not shown) formed on both sides of the lens. An example of a lighting device having a lens with lenslets is described in greater detail in U.S. Pat. No. 9,736,895, issued Aug. 15, 2017, entitled COLOR MIXING OPTICS FOR LED ILLUMINATION DEVICE, the entire disclosure of which is hereby incorporated by reference.

The lighting device 100 may comprise a reflector 130 that may be located within the housing heat sink 112 of the housing 110. The reflector 130 may be configured to reflect the light emitted by the emitter module 122 (e.g., the emission LEDs within the emitter module 122) towards the lens 115. The reflector 130 may shape the light produced by the emission LEDs within the emitter module 122 to shine out through the lens 115. The reflector 130 may comprise planar facets 132 (e.g., lunes) that may provide some randomization of the reflections of the light rays emitted by the emitter module 122 prior to exiting the lighting device 100 through the lens 115. The reflector 130 may be configured to sit on fins 134 inside of the housing heat sink 112 of the housing 110.

The lighting device 100 may comprise a power converter circuit 140 mounted to a power printed circuit board (PCB) 142. The power converter circuit 140 may be enclosed by the base portion 114 of the housing 110. The power converter circuit 140 may be electrically connected to the screw-in base 116, such that the power converter circuit may be an AC mains line voltage generated by the AC power source. The power converter circuit 140 may comprise a bus connector 144 that may be connected to the light-generation module 120. The power converter circuit 140 may be configured to convert the AC mains line voltage received from the AC power source into a direct-current (DC) bus voltage for powering the light-generation module 120. The power converter circuit 140 may comprise a rectifier circuit (e.g., a full-wave bridge rectifier) for converting the AC mains line voltage to a rectified voltage.

The light-generation module 120 may be mounted in a cavity 135 of the housing heat sink 112. The housing heat sink 112 may comprise a support portion 136 that may be connected to the base portion 114 of the housing 110. The light-generation module 120 may be mounted to the support portion 136 inside of the cavity 135 of the housing heat sink 112.

Figure 4:
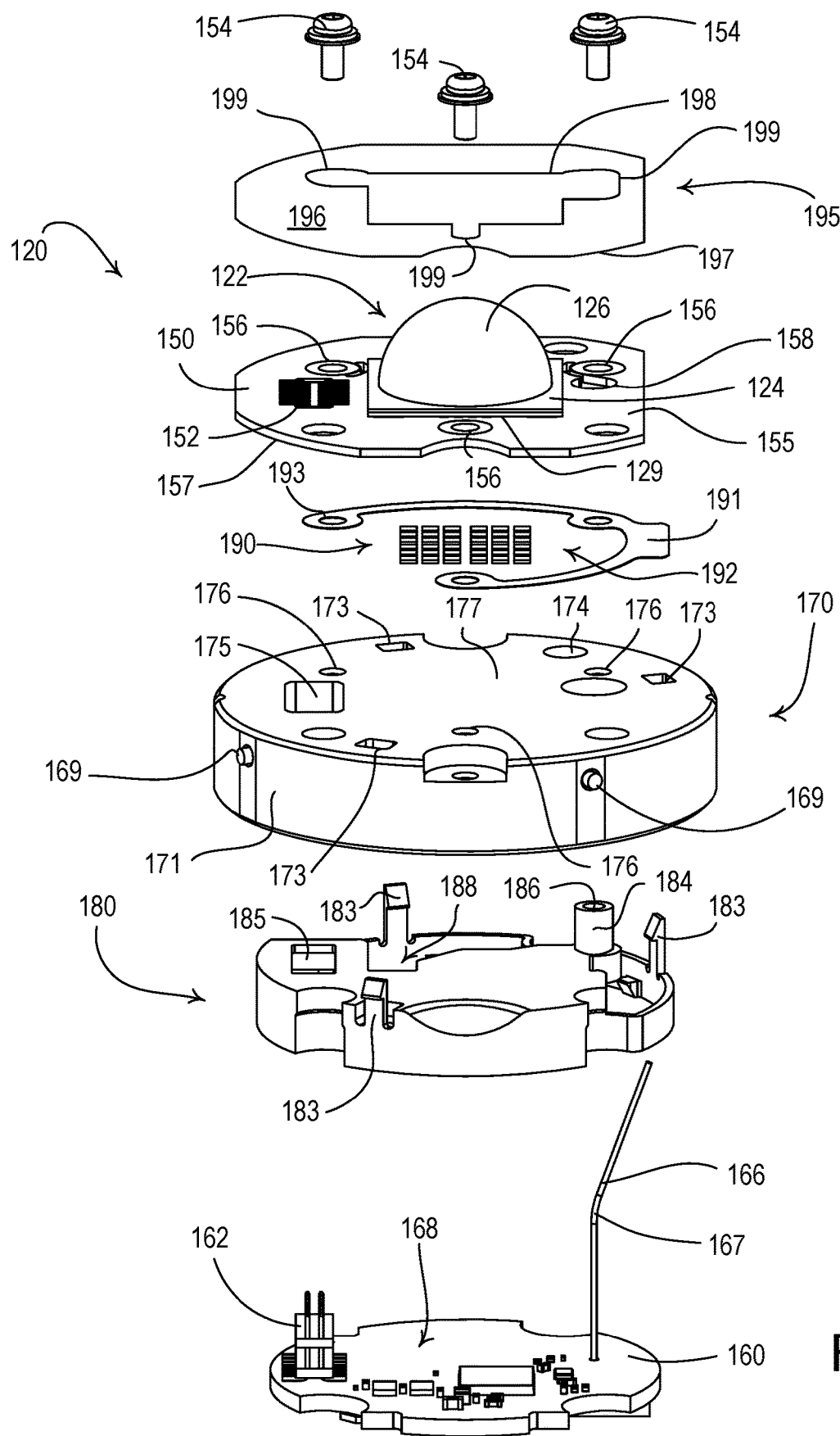
FIG. 4 is a top exploded view of a light-generation module of the lighting device of FIG. 1.
Figure 5:
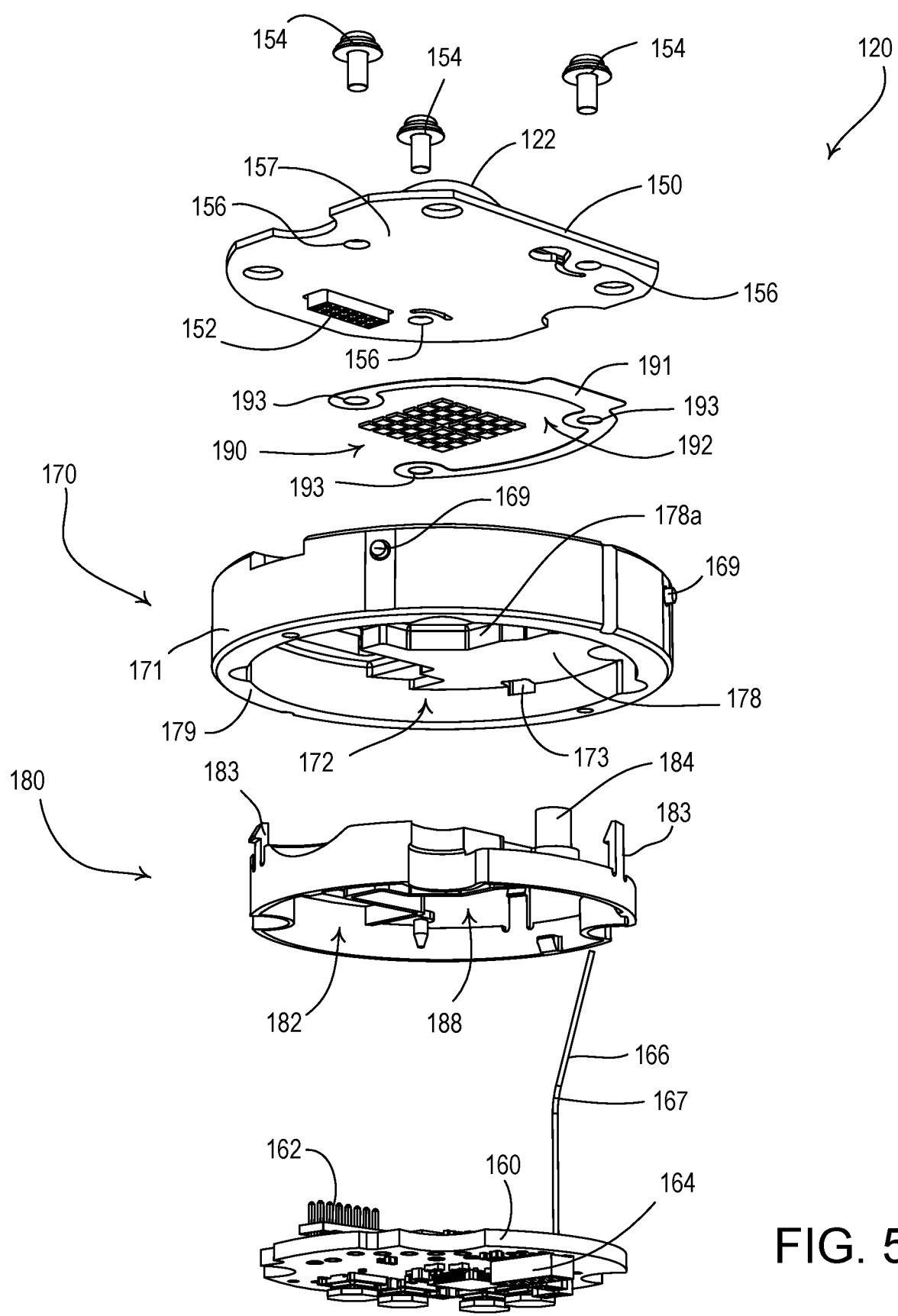
FIG. 5 is a bottom exploded view of the light-generation module of FIG. 4.

FIG. 4 is a top exploded view and FIG. 5 is a bottom exploded view of the light-generation module 120. The emitter module 122 may be mounted to a center of the carrier PCB 150. The emitter module 122 may comprise electrical pads (not shown) on a bottom surface of the substrate 124 that may be electrically connected (e.g., soldered) to corresponding electrical pads (not shown) on the carrier PCB 150. The light-generation module 120 may also comprise a control PCB 160 on which electrical circuitry may be mounted (e.g., as will be described in greater detail with reference to FIG. 12). The electrical circuitry mounted on the control PCB 160 may include one or more drive circuits for controlling the amount of power delivered to the emitter LEDs of the emitter module 122, one or more control circuits for controlling the drive circuits, and one or more wireless communication circuits for communicating wireless signal (e.g., radio-frequency (RF) signals) with external devices. The control PCB 160 may comprise a bus connector 164 configured to be attached to the bus connector 144 on the power PCB 142. The control PCB 160 may be arranged in a plane that is parallel to a plane of the carrier PCB 150. The carrier PCB 150 and the control PCB 160 may each have a circularly-shaped periphery.

The light-generation module 120 may comprise a module heat sink 170 and an insulator 180. The module heat sink 170 may be captured (e.g., sandwiched) between the carrier PCB 150 and the control PCB 160. The module heat sink 170 may be made from a thermally-conductive material (e.g., aluminum). The module heat sink 170 may define a planar front surface 177 having a circular periphery. The module heat sink 170 may have an outer sidewall 171 that extends from the periphery of the front surface 177, such that the module heat sink 170 has a cylindrical shape. Alternatively, the module heat sink 170 may have a truncated cone shape. The module heat sink 170 may comprise pins 169 (e.g., cylindrical pins) that extend from the sidewall 171 and may allow the heat-generation module 120 to be connected to the housing heat sink 112 of the housing 110 (e.g., as will be described in greater detail below). The module heat sink 170 may also define a recess 172 in a rear surface 179 of the module heat sink 170. The module heat sink 170 may be configured to radiate heat generated by the emitter module 122. For example, the module heat sink 170 may be configured to radiate heat generated by the emitter module 122 radially out through the sidewall 171.

The insulator 180 may also have a cylindrical shape and may be configured to be received in the recess 172 in the module heat sink 170. The insulator 180 may include a recess 182. The control PCB 160 may be received in the recess 182 in the insulator 180. The insulator 180 may be made of a suitable electrically insulating material, such as plastic. The insulator 180 may be configured to electrically isolate the control PCB 160 (e.g., the drive circuit, the control circuit, and the wireless communication circuit) from the module heat sink 170. The insulator 180 may comprise snaps 183 configured to attach to tabs (not shown) in openings 173 of the module heat sink 170 for connecting the insulator 180 to the module heat sink 170. The insulator 180 may comprise an extension 184 (e.g., a cylindrical extension) comprising a bore 186. The extension 184 of the insulator 180 may be received in a tunnel 174 (e.g., a cylindrical opening) that extends through the module heat sink 170. The carrier PCB 150 may comprise a carrier PCB connector 152, which may be electrically connected to a control PCB connector 162 on the control PCB 160, for example, to electrically couple the carrier PCB 150 and the control PCB 160. One or more (e.g., both) of the connectors 152, 162 may extend through an opening 175 in the module heat sink 170 and an opening 185 in the insulator 180.

The carrier PCB 150 may be connected to the module heat sink 170, such that a rear surface 157 of the carrier PCB 150 may contact the front surface 177 of the module heat sink 170. A thermally-conductive substance 190 (e.g., a plurality of beads of the thermally-conductive substance as shown in FIGS. 4 and 5) may be disposed between the rear surface 157 of the carrier PCB 150 and the front surface 177. A spacer 191 may also be located between the rear surface 157 of the carrier PCB 150 and the front surface 177 of the module heat sink 170, such that the thermally-conductive substance 190 is located in a void 192 of the spacer 191. The carrier PCB 150 may be connected to the module heat sink 170 via fasteners, such as screws 154. The screws 154 may be received through openings 156 in the carrier PCB 150, openings 193 in the spacer 191, and openings 176 in the module heat sink 170. The spacer 191 may operate to relieve stress on the carrier PCB 150 and the substrate 124 of the emitter module 122 as the screws 154 are tightened. For example, if the spacer 191 was not included, the carrier PCB 140 may bend due to the thermally-conductive substance 190 between the rear surface 157 of the carrier PCB 150 and the front surface 177 of the module heat sink 170, which could cause stress on the electrical connections (e.g., solder joints) between the carrier PCB 150 and the substrate 124 of the emitter module 122. In addition, the spacer 190 may be integral to the module heat sink 170 (e.g., extending from the front surface 177 of the module heat sink 170). Further, the module heat sink 170 may comprise a shallow recess (not shown) in the front surface 177 in which the thermally-conductive substance 190 may be located (e.g., and the spacer 190 may be omitted).

Figure 6:
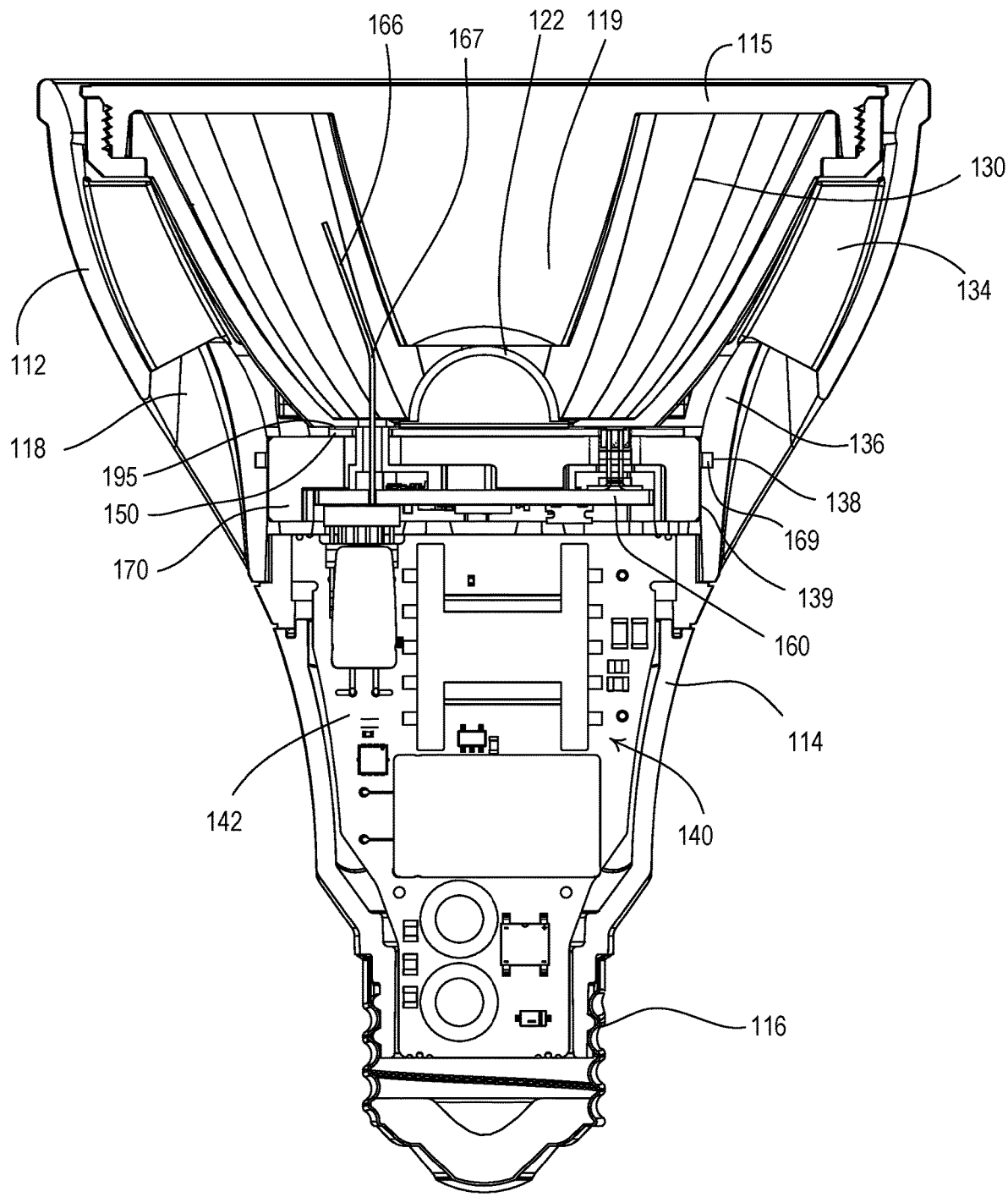
FIG. 6 is a side cross-section view of the lighting device of FIG. 1.
Figure 7:
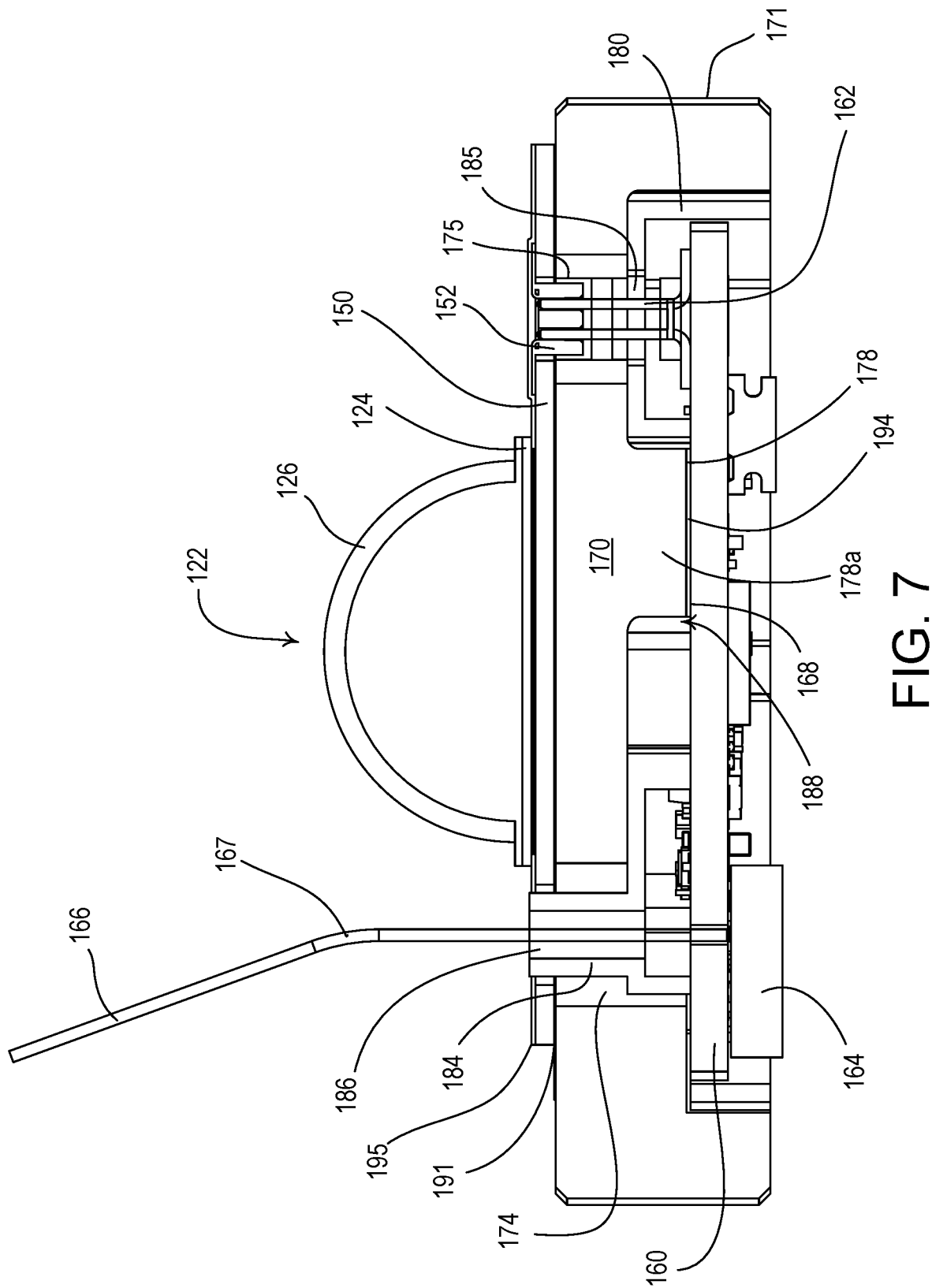
FIG. 7 is a side cross-section view of the light-generation module of FIG. 4.

The light-generation module 120 may comprise an antenna 166 electrically connected to at least one of the wireless communication circuits mounted to the control PCB 160. For example, the antenna 166 may comprise a plated wire. The antenna 166 may be electrically isolated from a control circuit on the control PCB 160. The antenna 166 may be configured to extend through the bore 186 of the extension 184 of the insulator 180 when the module heat sink 170 and the insulator 180 are captured between the carrier PCB 150 and the control PCB 160. For example, the extension 184 may electrically isolate the antenna 166 from the carrier PCB 150. FIG. 6 is a side cross-section view of the lighting device 100 taken through the center of the antenna 166 and through the connectors 152, 162 of the carrier PCB 150 and the control PCB 160, respectively. FIG. 7 is an enlarged side cross-section view of the light-generation module 120 taken through the same line as FIG. 6. The antenna 166 may also extend through an opening 158 in the carrier PCB 150 and into the emitter cavity 128 in which the emitter module 122 is located (e.g., as shown in FIG. 2). Since the emitter module 122 is mounted to the center of the carrier PCB 150, the antenna 166 may extend from the opening 158 in the carrier PCB towards the perimeter of carrier PCB. The antenna 166 may be in the path of the light that is emitted by the emitter module 122 and shines through the lens 115. The antenna 166 may comprise a bend 167 (e.g., a bent portion) to ensure that the antenna does not come into contact with the collector 119 of the lens 115 when the lens 115 is connected to the housing 110 (e.g., as shown in FIG. 6). Although the antenna 166 is shown with the bend 167, it should be appreciated that the antenna 166 may be straight (e.g., not comprise the bend 167). A distal portion of the antenna 166 may be configured to abut an inner surface of the lens 115. The antenna 166 may be capacitively coupled to and electrically isolated from the wireless communication circuit, for example, as described in commonly-assigned U.S. Pat. No. 9,155,172, issued Oct. 6, 2015, entitled LOAD CONTROL DEVICE HAVING AN ELECTRICALLY ISOLATED ANTENNA, the entire disclosure of which is hereby incorporated by reference.

The module heat sink 170 may operate as a counterpoise for the antenna 166. The control PCB 160 may comprise a ground plane to which the antenna 166 may be referenced. The ground plane may be located on a ground plane portion 168 (e.g., a vacant portion) of the control PCB 160, which may be vacant of any electrical components. The module heat sink 170 may be capacitively coupled to the ground plane in the ground plane portion 168 of the control PCB 160. For example, the module heat sink 170 may include an extension 178a that may extend towards the control PCB 160 to provide a coupling surface 178 adjacent to the control PCB. The coupling surface 178 may be configured to be capacitively coupled to the ground plane portion 168 of the control PCB 160 (e.g., when the control PCB 160 is located within the recess 182 of the insulator 180), such that the module heat sink 170 is capacitively coupled to the ground plane of the control PCB 160. The insulator 180 may include a void 188. The coupling surface 178 of the module heat sink 170 may extend through the void 188 in the insulator 180 toward the control PCB 160, such that the coupling surface 178 is located close to the ground plane in the ground plane portion 168 of the control PCB 160 (e.g., as shown in FIG. 7). An insulating material 194 (e.g., silicone or Kapton) may be located between the coupling surface 178 of the module heat sink 170 and the control PCB 160 (e.g., the ground plane portion 168 of the control PCB 160). For example, a capacitance of the capacitive coupling (e.g., the coupling surface 178) between the module heat sink 170 and the ground plane may be in the range of approximately 5 pF and 15 pF. In addition, the extension 178a may be shortened and/or eliminated such that the coupling surface 178 is located farther away from the ground plane portion 168 on the control PCB 160, which may decrease the capacitive coupling between the module heat sink 170 and the ground plane on the control PCB 160. When the extension 178a is shortened and/or eliminated, the void 188 of the insulator 180 may be eliminated (e.g., filled in with plastic between the heat sink 170 and the control PCB 160). In addition, the insulating material 194 may be eliminated. In this configuration, the wireless communication circuit on the control PCB 160 may be configured to transmit the wireless signals via the antenna 166 at a first frequency (e.g., approximately 2.4 GHz). With the extension 178a provided on the heat sink 170, such that the coupling surface 178 is adjacent to the ground plane portion 168 (e.g., as shown in FIG. 7), the wireless communication circuit on the control PCB 160 may be configured to transmit the wireless signals via the antenna 166 at a second frequency that is less than the first frequency (e.g., a sub-gigahertz frequency, such as approximately 900 MHz).

As shown in FIG. 4, the light-generation module 120 may further comprise a shield 195. The shield 195 may comprise a conductive top side 196 and a non-conductive bottom side 197. The shield 195 may comprise a central opening 198 (e.g., a square central opening) through which the emitter module 122 (e.g., the substrate 124 of the emitter module 122) may extend when the shield 195 is installed on the light-generation module 120. The central opening 198 may comprise notches 199 through which the screws 154 are received. The shield 195 may be located over a top surface 155 of the carrier PCB 150 in the emitter cavity 128. The shield 195 may be captured between the screws 154 and a top surface 155 of the carrier PCB 150. The shield 195 may be electrically coupled to the module heat sink 170. The screws 154 may contact the top side 196 of the shield 196 to electrically couple the top side 196 of the shield 195 to the module heat sink 170. The bottom side 197 of the shield may not be electrically conductive, such that the carrier PCB 150 is electrically isolated from (e.g., not electrically coupled to) the shield 195. The antenna 166 may extend through one of the notches 199 in the shield 195 above the opening 158 in the carrier PCB 150, such that the antenna 166 is not electrically coupled to the shield 195. The shield 195 may reduce (e.g., minimize) noise from the drive circuits on the control PCB 160 from coupling to the reflector 130 (e.g., when the shield 195 is electrically coupled to the carrier PCB 150), which may prevent the reflector 130 from reradiating noise (e.g., to the antenna 166).

As shown in FIG. 6, the light-generation module 120 may be mounted to the support portion 136 of the housing heat sink 112 of the housing 110. During installation of the light-generation module 120 into the housing heat sink 112 of the housing 110, the pins 169 of the module heat sink 170 may each be received in a respective vertical slot (not shown) in an inner surface 139 of the support portion 136. The light-generation module 120 may then be turned with respect to the housing heat sink 112, such that the pins 169 may each move through a respective horizontal groove 138 until the light-generation module 120 is locked in place in the housing heat sink 112. In addition, the light-generation module 120 may be installed in the housing heat sink 112 by pressing the module heat sink 170 to fit in the inner surface 139 of the support portion 136 (e.g., a press fit) to provide a large amount of contact surface between the sidewall 171 of the module heat sink 170 and the inner surface 139 of the support portion 136. In some embodiments, the pins 169 may be omitted.

The housing heat sink 112 may operate as an additional heat sink for the lighting device 100. The sidewall 171 of the module heat sink 170 may be thermally coupled to the inner surface 139 of the support portion 136. The module heat sink 170 may transfer heat to the housing heat sink 112 peripherally. The housing heat sink 112 may be made from a material that is cheaper, but less thermally conductive than the material of the module heat sink 170. The housing heat sink 112 may be larger in volume and may have more surface area than the module heat sink 170. When the lighting device 100 is powered and the emitter module 122 is generating light, heat may be conducted from the substrate 126 through the carrier PCB 150 through the module heat sink 170 (e.g., in through the front surface 177 and out through the sidewall 171) and into the housing heat sink 112. Air may enter the cavity 135 of the housing heat sink 112 via the vents 118 for cooling the housing heat sink 112 via convection cooling. Additionally or alternatively, the module heat sink 170 of the light-generation module 120 may also be connected to and/or thermally coupled to the base portion 114 of the housing 110. Stated a different way, the lighting device 100 may comprise a first heat sink (e.g., the module heat sink 170) and a second heat sink (e.g., the housing heat sink 112) that are thermally coupled to each other, where the first heat sink may be smaller in volume than the second heat sink, and the first heat sink may be made from a material that is more thermally conductive than a material of the second heat sink.

Figure 8:
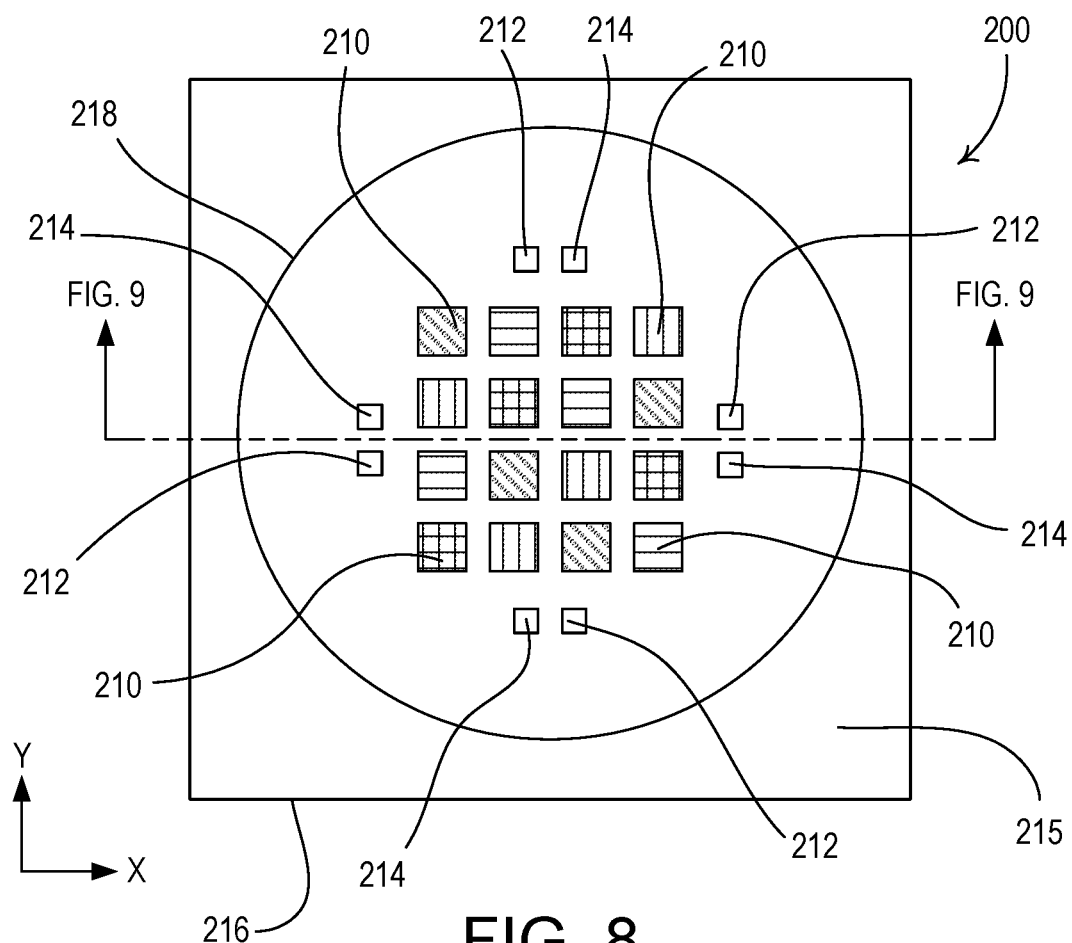
FIG. 8 is a top view of an example emitter module of a lighting device, such as the lighting device of FIG. 1.
Figure 9:
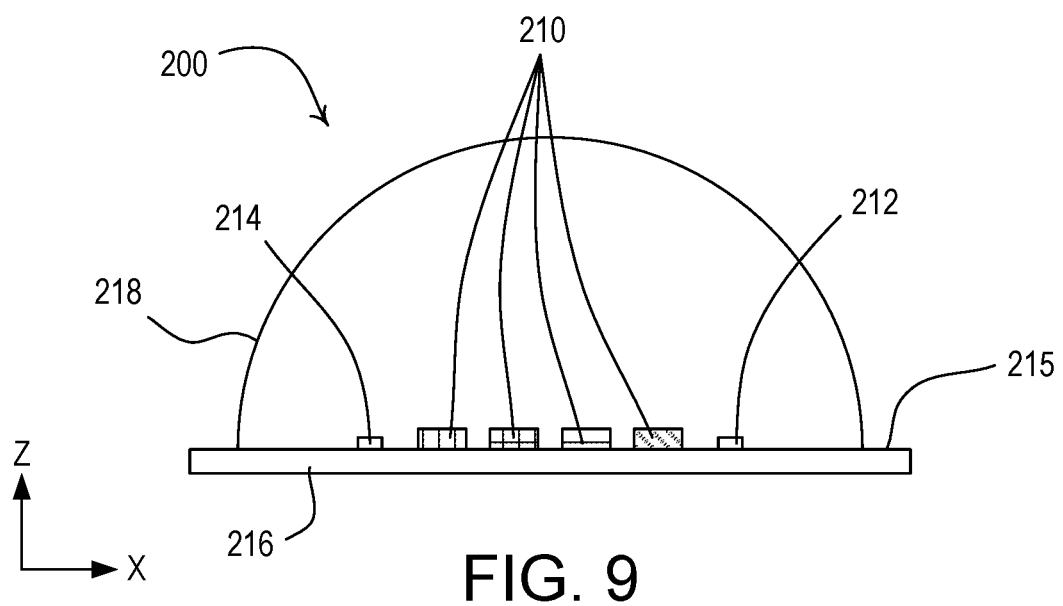
FIG. 9 is a side cross-section view of the emitter module of FIG. 8.

FIG. 8 is a top view of an example emitter module 200 of a lighting device (e.g., the emitter module 122 of the lighting device 100). FIG. 9 is a side cross-section view of the emitter module 200 taken through the center of the emitter module (e.g., through the line shown in FIG. 8). The emitter module 200 may comprise an array of emitters 210 (e.g., emission LEDs) and detectors 212, 214 (e.g., detection LEDs) mounted on a substrate 216 and encapsulated by a primary optics structure, such as a dome 216. For example, the emitter module 200 may comprise an array of sixteen emitters 210 and eight detectors 212, 214. The size of the dome 218 (e.g., a diameter of the dome in a plane of the emitters 210) may be generally dependent on the size of the array of emitters 210. The emitters 210, the detectors 212, 214, the substrate 216, and the dome 218 may form an optical system. The emitters 210 may be arranged in a square array as close as possible together in the center of the dome 218, so as to approximate a centrally located point source.

The emitter module 200 may include multiple "chains" of emitters 210 (e.g., series-coupled emitters). The emitters 210 of each chain may be coupled in series and may conduct the same drive current. Each chain may include emitters 210 that produce illumination at a different peak emission wavelength (e.g., emit light of the same color). The emitters 210 of different chains may emit light of different colors. For example, the emitter module 200 may comprise four differently-colored chains of emitters 210 (e.g., red, green, blue, and white or yellow). The array of emitters 210 may include a chain of four red emitters, a chain of four green emitters, a chain of four blue emitters, and a chain of four white or yellow emitters. The individual emitters 210 in each chain may be scattered about the array, and arranged so that no color appears twice in any row, column, or diagonal, to improve color mixing within the emitter module 200.

The detectors 212, 214 may be located in pairs close to each edge of the array of emitters 210 and/or and in the middle of the array of emitters 210. Similar to the emitters 210, the detectors 212, 214 are LEDs that can be used to emit or receive optical or electrical signals. When the detectors 212, 214 are coupled to receive optical signals and emit electrical signals, the detectors may produce current indicative of incident light from, for example, an emitter, a plurality of emitters, or a chain of emitters. The detectors 212, 214 may be any device that produces current indicative of incident light, such as a silicon photodiode or an LED. For example, the detectors 212, 214 may each be an LED having a peak emission wavelength in the range of approximately 550 nm to 700 nm, such that the detectors may not produce photocurrent in response to infrared light (e.g., to reduce interference from ambient light). For example, the first detector 212 of each pair of detectors may comprise a small red, orange or yellow LED, which may be used to measure a luminous flux of the light emitted by the red LEDs of the emitters 210. The second detector 214 may comprise a green LED, which may be used to measure a respective luminous flux of the light emitted by each of the green and blue LEDs of the emitters 210. Both of the first and second detectors 212, 214 may be used to measure the luminous flux of the white LED of the emitters 210 at different wavelengths (e.g., to characterize the spectrum of the light emitted by the white LED). The first detectors 212 may be coupled in parallel in the emitter module 122. Similarly, the second detectors 214 may be coupled in parallel in the emitter module 122.

Figure 10A:
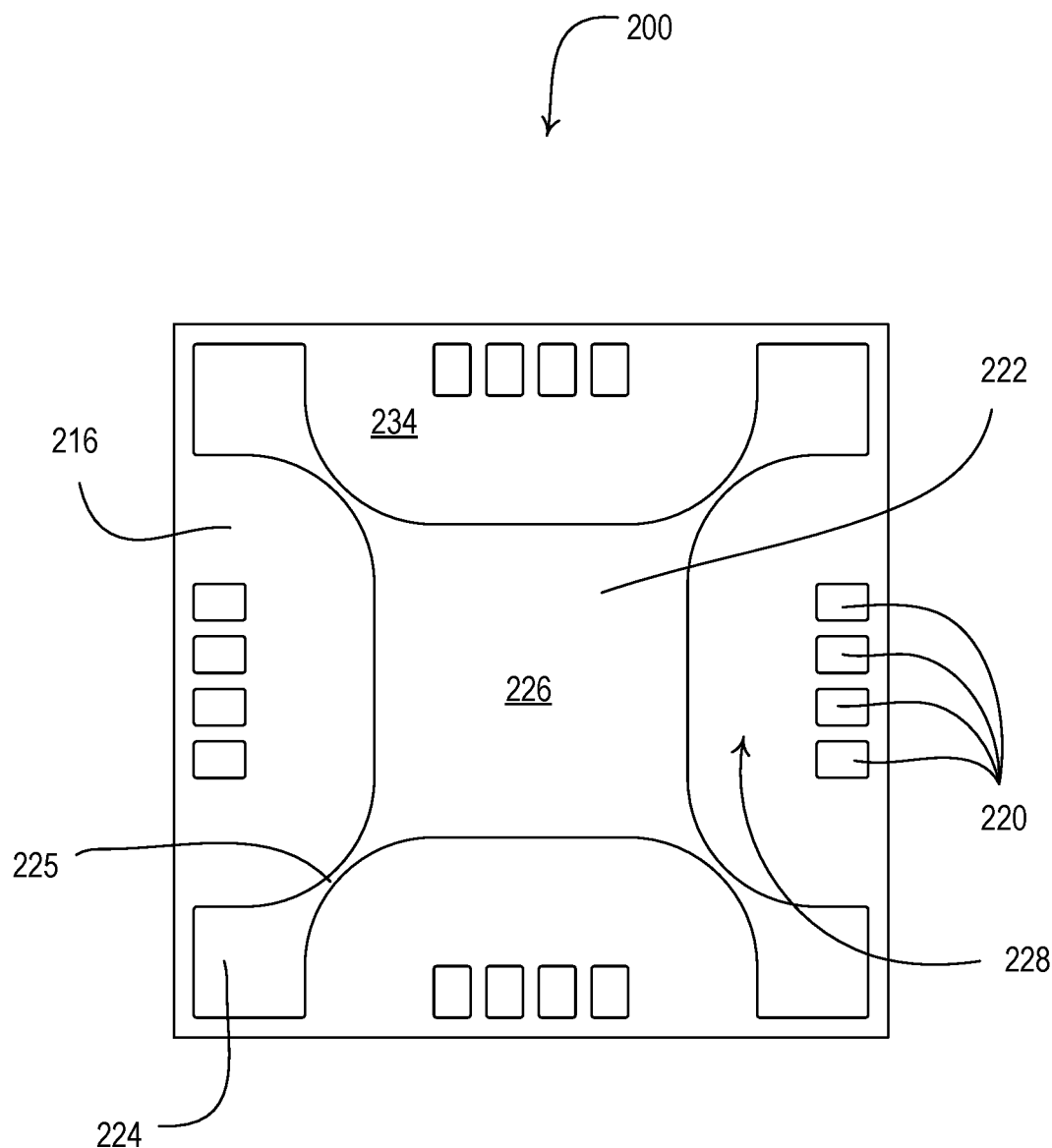
FIG. 10A is a bottom view of the emitter module of FIG. 8.

FIG. 10A is a bottom view of the emitter module 200. The emitter module 200 may comprise multiple sets of electrical pads 220 around the perimeter of the substrate 216. For example, the emitter module 200 may comprise four sets of four electrical pads 220 with each set of electrical pads located near the center of each side of the substrate 216 as shown in FIG. 10A. The electrical pads 220 may be connected to the series-connected emitters 210 and the parallel-connected detectors 212, 214 on a top surface 215 of the substrate 216. The electrical pads 220 may be electrically connected (e.g., soldered) to corresponding electrical pads on a carrier (e.g., the carrier PCB 150) to provide electrical connection between one or more drive circuits and the emitters 210 and between the detectors 212, 214 and a receiver circuit. One set of the electrical pads 220 may not be connected to the emitters 210 and/or detectors 212, 214, and may simply be soldered to the corresponding pads on the carrier PCB to provide support for the substrate 216. For example, the electrical pads 220 that are not connected to the emitters 210 and/or detectors 212, 214 may be located along the side of the emitter module 200 that may be located near a mounting screw of the carrier PCB (e.g., such as a side 129 located close to one of the openings 156 in the carrier PCB 150 that receives one of the screws 154 as shown in FIG. 4) since those electrical pads may be stressed when the mounting screw is tightened during assembly of the lighting device.

The emitter module 200 may also comprise a heat sink pad 222. The heat sink pad 222 may comprise four corner pads 224 (e.g., distal portions) that are connected to a central pad 226 (e.g., a central portion) via respective arms 225. The corner pads 224 may be located in the corners of the substrate 216. The heat sink pad 222 may be connected (e.g., soldered to) a corresponding pad on the carrier PCB, which may be electrically connected to a ground plane of the carrier PCB (e.g., which may be coupled to an output circuit common connection of the rectifier circuit of the power converter circuit 140). Since the emitters 210 and detector 212, 214 may be electrically isolated from the ground plane of the carrier PCB, the heat sink pad 222 may be spaced apart from the electrical pads 220 by keep-out regions 228. The heat sink pad 222 may operate to conduct heat from the emitters 210 and the substrate 216 to the carrier PCB and a heat sink (e.g., the module heat sink 170). In addition, the heat sink pad 222 may operate to reduce stress on the solder connections between the electrical pads 220 and the corresponding electrical pads on the carrier PCB during installation of the carrier PCB to the heat sink. Alternatively, the arms 225 of the heat sink pad 222 may be omitted, such that the corner pads 224 simply comprise square-shaped pads that are not connected to the central pad 226.

Figure 10B:
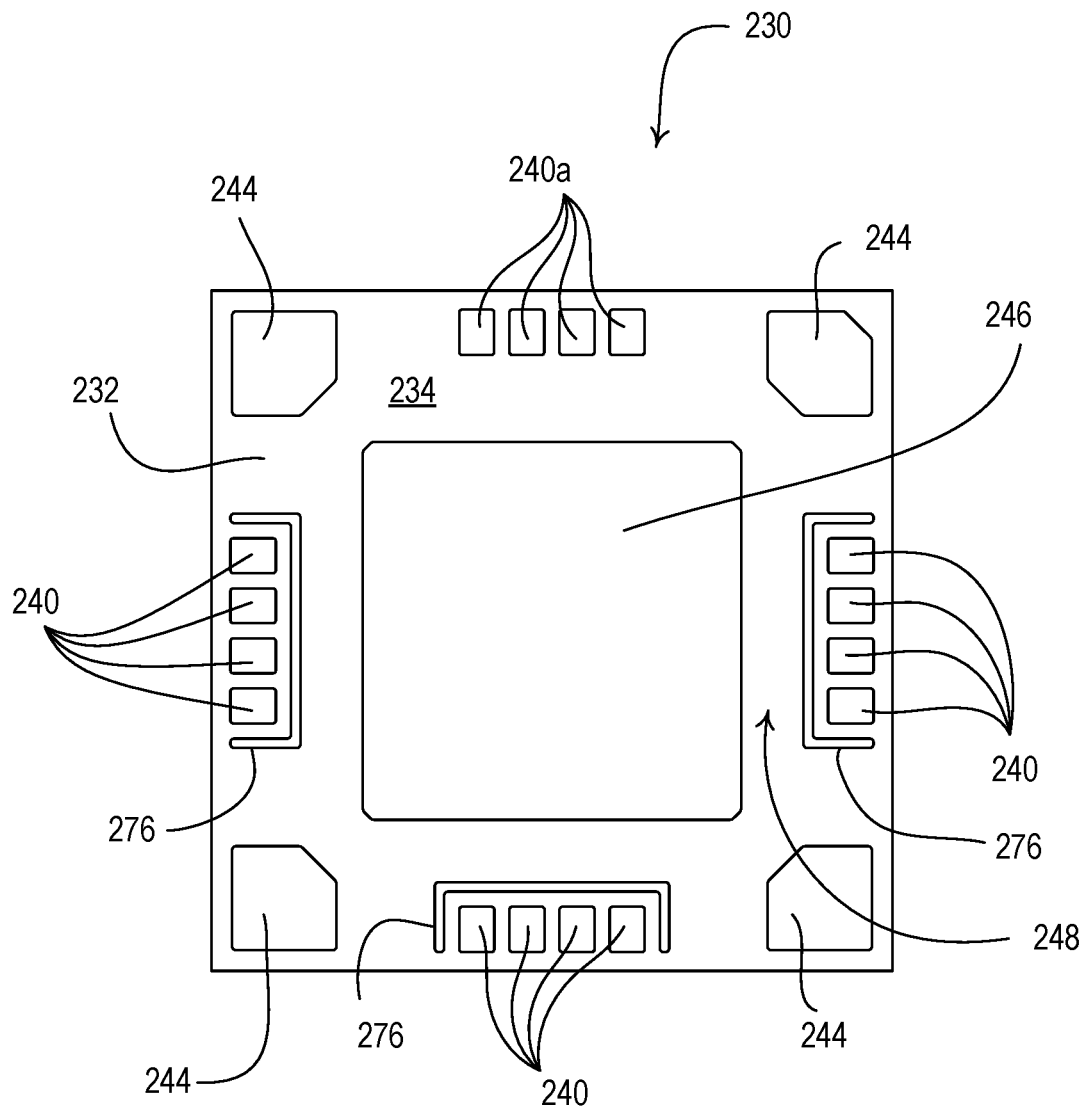
FIG. 10B is a bottom view of another example emitter module of a lighting device.
Figure 10C:
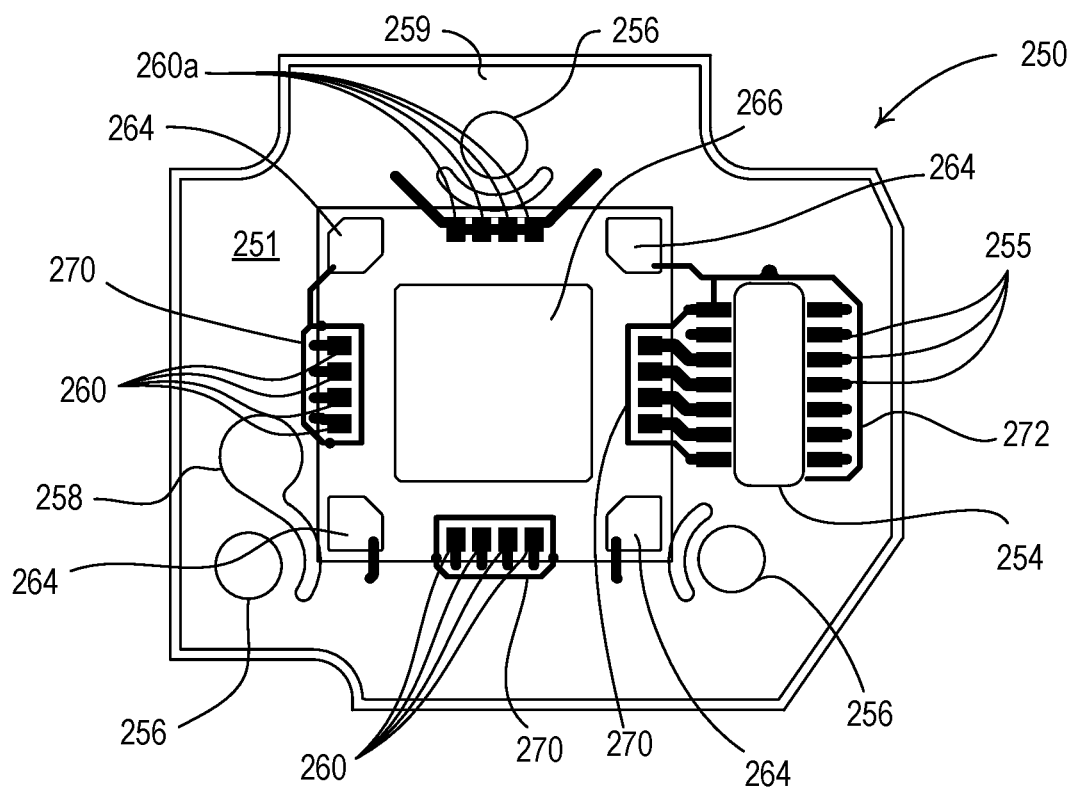
FIG. 10C is a top view of an example printed circuit board to which the emitter module of FIG. 10B may be mounted.
Figure 10D:
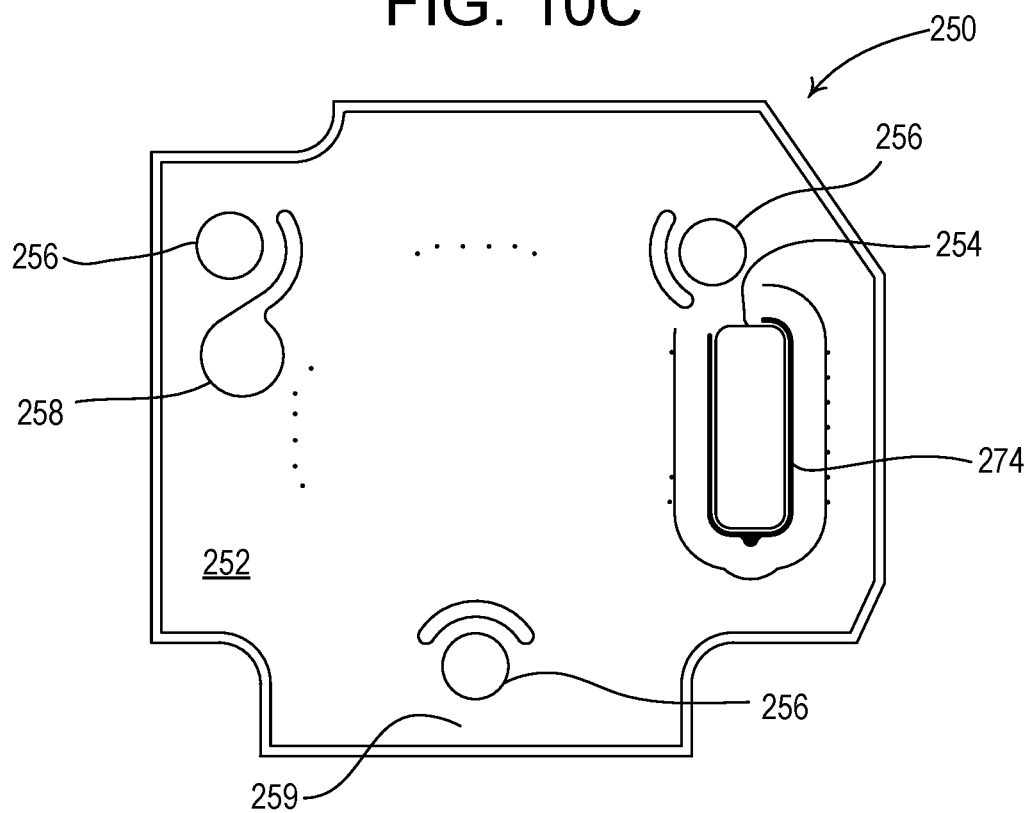
FIG. 10D is a bottom view of the printed circuit board of FIG. 10C.

FIG. 10B is a bottom view of another example emitter module 230 of a lighting device (e.g., the emitter module 122 of the lighting device 100). FIG. 10C is a top view and FIG. 10D is a bottom view of an example carrier PCB 250 to which the emitter module 230 may be mounted. The carrier PCB 250 may comprise a top side 251 and a bottom side 252. The carrier PCB 250 may comprise an opening 254 through which a connector (e.g., the carrier PCB connector 152) may extend, e.g., for connecting the emitter module 230 to one or more drive circuits and/or a receiver circuit on a control PCB (e.g., the control PCB 160). The connector may have a plurality of pins that may be mounted to respective electrical pads 255 on the top side 252 of the carrier PCB 250 (e.g., as shown in FIG. 4). The carrier PCB 250 may comprise a plurality of openings 256 (e.g., the openings 156 in the carrier PCB 150) through which mounting screws for the carrier PCB 250 (e.g., the screws 154) may be received. The carrier PCB 250 may also comprise an opening 258 (e.g., the opening 158 in the carrier PCB 150) through which an antenna (e.g., the antenna 166) of the lighting device may extend.

The emitter module 230 may comprise a substrate 232 (e.g., the substrate 216) having multiple sets of electrical pads 240 on a bottom surface 234 of the substrate 232 (e.g., arranged around a perimeter of the substrate 232). For example, the emitter module 230 may comprise four sets of four electrical pads 240, 240a with each set of electrical pads located near the center of each side of the substrate 232 as shown in FIG. 10B. The electrical pads 240 may be connected to series-connected emitters (e.g., the emitters 210) and parallel-connected detectors (e.g., the detectors 212, 214) on the top side of the substrate 232. The electrical pads 240 may be electrically connected (e.g., soldered) to corresponding electrical pads 260 on the top side 252 of the carrier PCB 250 to provide electrical connection between the drive circuits and the respective emitters 210, and/or between the receiver circuit and the detectors 212, 214. One set of the electrical pads on the carrier PCB 250 (e.g., the electrical pads 240a) may not be connected to the emitters 210 and the detectors 212, 214, and may simply be soldered to the corresponding pads 260a on the carrier PCB to provide support for the substrate 232. For example, the electrical pads 240a that are not connected to the emitters 210 and the detectors 212, 214 may be located along the side of the emitter module 230 that may be located near a mounting screw of the carrier PCB (e.g., such as a side 259 located close to one of the openings 256 in the carrier PCB 250 that receives one of the mounting screws) since those electrical pads may be stressed when the mounting screw is tightened during assembly of the lighting device.

The emitter module 200 may also comprise one or more heat sink pads including four corner pads 244 and a central pad 246. The corner pads 244 and the central pad 246 may be a thermally conductive and electrically insulating material (e.g., ceramic, etc.). The corner pads 244 may be connected (e.g., soldered to) a corresponding corner pads 264 on the top side 251 of the carrier PCB 250. The central pad 246 may be connected (e.g., soldered to) a corresponding central pad 266 on the top side 251 of the carrier PCB 250. The corner pads 244 and the central pad 266 on the carrier PCB 250 may be electrically connected to a ground plane of the carrier PCB 250. The corner pads 244 and the central pad 246 on the substrate 232 may be spaced apart from the electrical pads 240 by keep-out regions 248 (e.g., since the emitters 210 and detectors 212, 214 of the emitter module 230 may be electrically isolated from the ground plane of the carrier PCB 250). The corner pads 244 and the central pad 246 may operate to conduct heat from the emitters 210 and the substrate 232 to the carrier PCB 250 and a heat sink (e.g., the module heat sink 170). In addition, the corner pads 244 and the central pad 246 may operate to reduce stress on the solder connections between the electrical pads 240, 240a and the corresponding electrical pads 260, 260a on the carrier PCB 250 during installation of the carrier PCB 250 to the heat sink. The corner pads 244 and the central pad 246 may result in a substantially reduced strain on the solder connections when compared to thermal grease.

The carrier PCB 250 may comprise electrostatic discharge (ESD) traces 270 surrounding the electrical pads 240 for the emitter module 230 on the top side 251 of the carrier PCB 250. The carrier PCB 250 may also comprise an ESD trace 272 on the top side 251 adjacent to the electrical pads 255 for the connector and an ESD trace 274 on the bottom side 252 surrounding the opening 254 through which the connector extends. The emitter module 230 may comprise ESD traces 276 on the bottom surface 234 of the substrate 232 surrounding the electrical pads 240. The ESD traces 270, 272, 274, 276 may be traces of exposed conductive material (e.g., copper) and may be electrically connected to the ground plane of the emitter PCB 250. The ESD traces 270, 272, 274, 276 may operate to conduct ESD charges to the ground plane and present ESD charges from reaching the emitters 210 and/or detectors 212, 214 of the emitter module 230. Because of the ESD traces 270, 272, 274, 276 on the emitter module 230 and the carrier PCB 250, the keep-out regions 248 of the emitter module 230 may be smaller in size, which may allow the central pad 246 of the emitter module 230 to also be larger (e.g., providing better ability to conduct heat from the emitters 210 and the substrate 232 and/or providing better support to reduce stress on the solder connections between the electrical pads 240, 240a and the corresponding electrical pads 260, 260a on the carrier PCB 250). The ESD traces 270, 272, 274, 276 may enable the one or more heat sink pads (e.g., pads 244, 246) to cover more surface area on the bottom surface 234 of the substrate 232, which also provides a better ability to conduct heat from the emitters 210 and the substrate 232 and/or provides better support to reduce stress on the solder connections between the electrical pads 240, 240a and the corresponding electrical pads 260, 260a on the carrier PCB 250.

Figure 11:
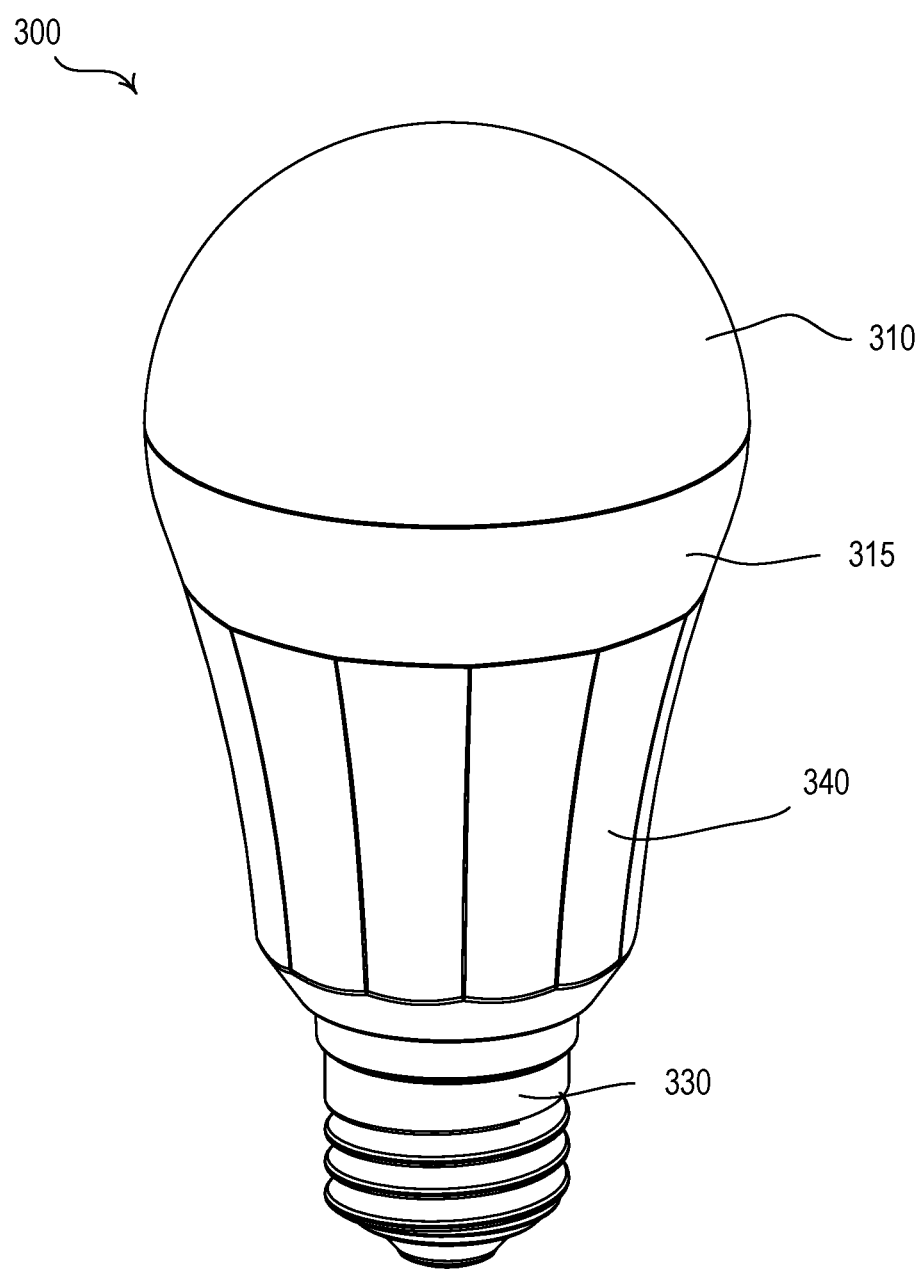
FIG. 11 is a perspective view of an example lighting device.
Figure 12:
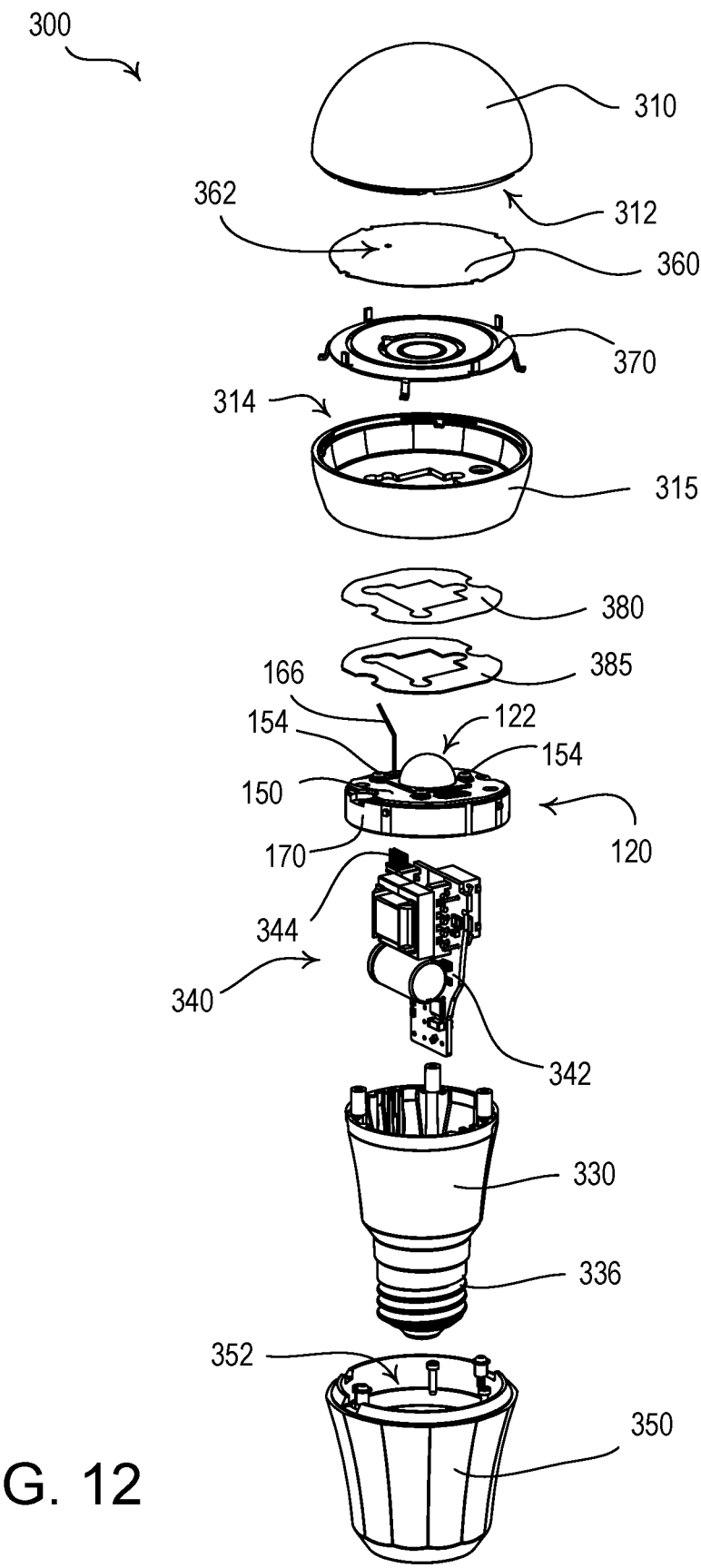
FIG. 12 is an exploded view of the example lighting device shown in FIG. 11.

FIG. 11 is a perspective view of a lighting device 300 (e.g., an illumination device) that is configured to receive the light-generation module 120. FIG. 12 is an exploded view of the lighting device 300. The lighting device 300 may include an upper dome 310, a lower dome 315, an inner sleeve 330, and a housing heat sink 350. The light-generation module 120 may be configured to be installed in multiple lighting device types (e.g., such as the lighting device 100, the lighting device 300, etc.). Using the same light-generation module (e.g., light-generation module 120) in multiple lighting device types may improve supply chain logistics. For example, using the light-generation module 120 in multiple lighting device types may enable calibration of the light-generation module 120 to be performed in one facility and assembly of the lighting device (e.g., lighting device 100, lighting device 300, etc.) to be performed in another facility, which may further improve supply chain logistics. The light-generation module 120 may be mounted (e.g., press fit) within the housing heat sink 350.

The emitter module 122 of the light-generation module 120 may be configured to shine light through the upper dome 310. The upper dome 310 may be a lens made of any suitable material, for example glass. The upper dome 310 may be transparent or translucent and may be flat or domed, for example. The inner sleeve 330 may include a screw-in base 336. The screw-in base 336 may be configured to be screwed into a standard Edison socket for electrically coupling the lighting device 300 to an alternating-current (AC) power source. The upper dome 310 may define an upper dome cavity 312 (e.g., an optical cavity). The upper dome cavity 312 may be defined by the upper dome 310, a diffuser 360, and/or a reflector 370. The lower dome 315 may define a lower dome cavity 314 (e.g., an optical cavity). The lower dome cavity 314 may be defined by the lower dome 315, the diffuser, and/or the reflector 370. The upper dome cavity 312 and the lower dome cavity 314 may collectively be referred to as an optical cavity defined by the upper dome 310, the reflector 370, and the carrier PCB 150.

The housing heat sink 350 may be configured to be thermally coupled to the light-generation module 120. For example, the sidewall 171 of the module heat sink 170 may be thermally coupled to an inner surface 352 of the housing heat sink 350. The module heat sink 170 may transfer heat to the housing heat sink 350 peripherally. The housing heat sink 350 may be made from a material that is cheaper, but less thermally conductive than the material of the module heat sink 170. The housing heat sink 350 may be larger in volume and may have more surface area than the module heat sink 170. When the lighting device 300 is powered and the emitter module 122 is generating light, heat may be conducted from the substrate 124 through the carrier PCB 150 through the module heat sink 170 (e.g., in through the front surface 177 and out through the sidewall 171) and into the housing heat sink 350.

The lighting device 300 may include a reflector 370. The reflector 370 may be located within the lower dome 315 of the lighting device 300. The reflector 370 may be configured to shape the light, produced by the emission LEDs within the emitter module 122, to shine out through the upper dome 310. For example, the reflector 370 may be configured to create an omni-directional light appearance through the upper dome 310. The reflector 370 may reflect a portion of the emitted light back toward the light-generation module 120. The lighting device 300 may include a diffuser 360. The diffuser 360 may be configured to disperse the light (e.g., more evenly) across the upper dome 310. The diffuser 360 may include a hole 362. The hole 362 may be configured to receive the antenna 166 of the light-generation module 120 (e.g., such that the antenna extends into an optical cavity of the lighting device 300). The antenna 166 of the light-generation module 120 may extend into the lower dome cavity 314 and/or the upper dome cavity 312. The diffuser 360 may be configured to keep the antenna 166 away from the reflector 370 (e.g., the metal of the reflector 370). For example, the hole 362 may be located such that the antenna 166 does not contact the reflector 370. Accordingly, the hole 362 of the diffuser 360 may help with ensuring that the antenna 166 does not contact the reflector 370, and in turn, is not affected by noise that would otherwise be caused by contact with the reflector 370. As such, RF performance of the antenna 166 may be improved. A distal portion of the antenna 166 may be configured to abut an inner surface of the upper dome 310.

The lighting device 300 may include a reflective sheet 380 and/or a flame-retardant sheet 385 (e.g., a formex sheet). The reflective sheet 380 may be configured to redirect towards the upper dome 310 the light reflected back toward the light-generation module 120 by the reflector 370. That is, the light-generation module 120 may emit light towards the upper dome 310, and when doing so, the reflector 370 may reflect light back toward the light-generation module 120. So, the reflective sheet 380 may redirect this reflected light back toward the upper dome 310, thereby ensuring additional light is emitted from the lighting device 300 into the space and reducing the heat that is generated within the lighting device 300. The flame-retardant sheet 385 may be configured as a flame barrier, for example, between the light-generation module 120 and the space outside the lighting device 300.

The lighting device 300 may include a power converter circuit 340 mounted to a power printed circuit board (PCB) 342. The power converter circuit 340 may be enclosed by the inner sleeve 330 of the lighting device 300. The power converter circuit 340 may be electrically connected to the screw-in base 336, such that the power converter circuit may be an AC mains line voltage generated by the AC power source. The power converter circuit 340 may comprise a bus connector 344 that may be connected to the light-generation module 120. The power converter circuit 140 may be configured to convert the AC mains line voltage received from the AC power source into a direct-current (DC) bus voltage for powering the light-generation module 120. The power converter circuit 140 may comprise a rectifier circuit (e.g., a full-wave bridge rectifier) for converting the AC mains line voltage to a rectified voltage. The bus connector 164 of the control PCB 160 of the light-generation module 120 may be connected to the bus connector 344 on the power PCB 342 for powering the drive circuits, the control circuits, and the wireless communication circuits on the control PCB. The control PCB 160 may be arranged in a plane that is parallel to a plane of the carrier PCB 150.

Figure 13:
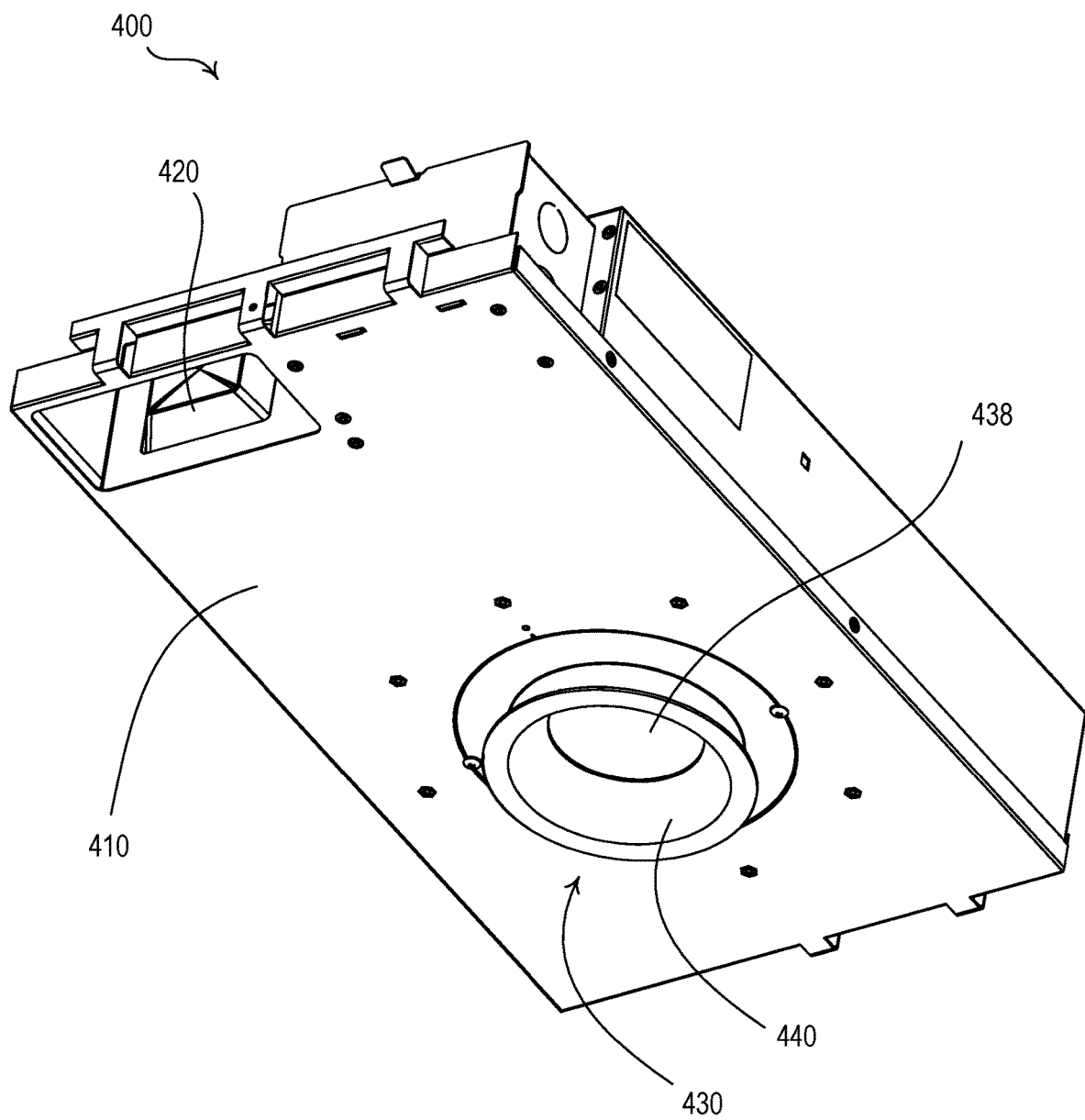
FIG. 13 is a perspective view of another example lighting device.
Figure 14:
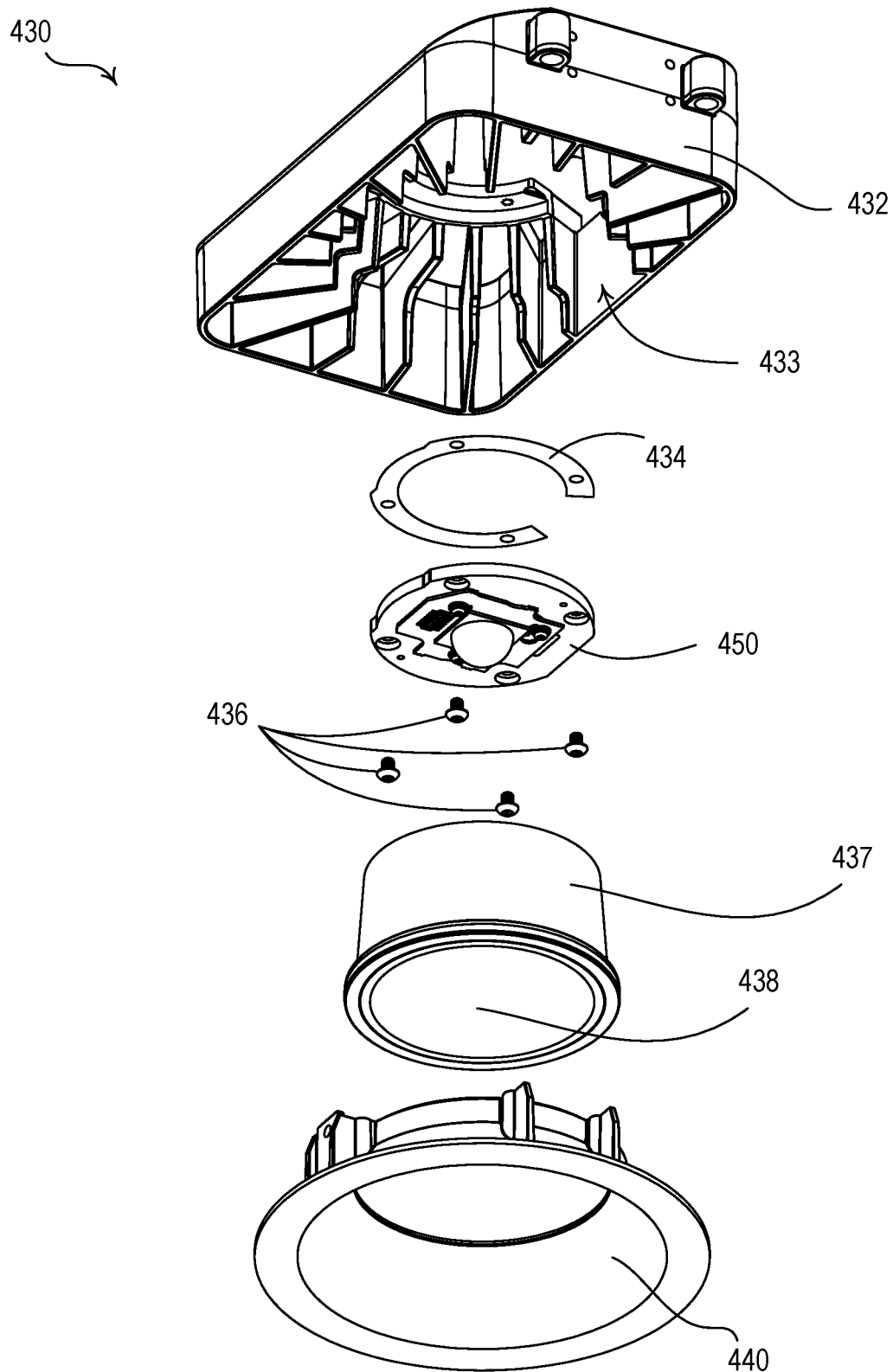
FIG. 14 is an exploded view of a lighting device assembly of the example lighting device shown in FIG. 13.

FIG. 13 is a perspective view of another example lighting device 400 (e.g., an illumination device). FIG. 14 is an exploded view of the lighting device 400. The lighting device 400 may include a housing 410, a power supply and control module 420, and a lighting device assembly 430. The housing 410 may be configured to enclose the power supply and control module 420 and a portion of the lighting device assembly 430. The housing 410 may be configured to be installed within a structure (e.g., a ceiling). When the housing 410 is installed within the structure a portion of the lighting device assembly 430 may extend from the structure.

The power supply and control module 420 may include a power converter circuit and/or a wireless communication circuit (e.g., a wireless receiver). The power supply and control module 420 may be coupled to an alternating-current (AC) power source for receiving an AC mains line voltage $V_{AC}$. For example, the power converter circuit of the power supply and control module 420 may receive the AC mains line voltage $V_{AC}$ and may generate aa bus voltage $V_{BUS}$ for powering the lighting device assembly 430. The power supply and control module 420 may also comprise an internal power supply circuit (not shown) that may receive the bus voltage $V_{BUS}$ and generate a DC supply voltage $V_{CC}$ for powering the wireless communication circuit and other low-voltage circuitry of the power supply and control module 420. The bus voltage $V_{BUS}$ and the DC supply voltage $V_{CC}$ may be used to power one or more of the lighting device assembly 430, the wireless communication circuit, a memory, and other low-voltage circuitry of the lighting device 400. The wireless communication circuit may be coupled to an antenna for receiving and/or sending wireless control signals to/from remote control devices. For example, the wireless communication circuit may include a radio-frequency (RF) transceiver coupled to an antenna for transmitting and/or receiving RF signals. The wireless communication circuit may be an RF transmitter for transmitting RF signals, an RF receiver for receiving RF signals, or an infrared (IR) transmitter and/or receiver for transmitting and/or receiving IR signals. Alternatively, the power supply and control module 420 may include one or more of a transmitter for transmitting wireless control signals, a transceiver for transmitting and receiving wireless control signals, or an infrared (IR) receiver for receiving IR signals.

The lighting device assembly 430 may include a housing heat sink 432, a thermal interface 434, a light-generation module 450, a lens 438, and a trim 440. The light-generation module 450 may be configured to emit light. The lens 438 may be located within a cylindrical portion 437 of the lighting device assembly 430. The lighting device assembly 430 may include a reflector (not shown). The reflector (e.g., such as the reflector 130 and/or the reflector 370) may be located within the cylindrical portion 437. The lens 438 may be made of any suitable material, for example glass. The lens 438 may be transparent or translucent and may be flat or domed, for example. The lens 438 may be configured to direct the light emitted by the light-generation module 450 into a beam of light. For example, the lens 438 may diffuse the light emitted by the light-generation module 450. The lighting device assembly 430 may be configured to receive various lenses (e.g., such as the lens 438) with varying physical, diffusive, and/or translucent properties. The trim 440 may be configured to cover (e.g., hide from view) an opening in the structure. The trim 440 may be configured to further direct the light emitted by the light-generation module 450. The lighting device assembly 430 may be configured to receive various trims (e.g., such as the trim 440) with varying physical properties.

The housing heat sink 432 may be thermally coupled to the light-generation module 450. For example, the housing heat sink 432 is configured to dissipate the heat generated by the light-generation module 450. The thermal interface 434 may be located between the light-generation module 450 and the housing heat sink 432. The thermal interface 434 may be an elastomeric pad, a thermal tape, a phase change material, or similar. The thermal interface 434 may include phase change materials. The thermal interface 434 may be configured to reduce thermal resistance between the light-generation module 450 and the housing heat sink 432. For example, the thermal interface 434 may be configured to adjust a thermal path between the light-generation module 450 and the housing heat sink 432, for example, by filling air gaps created between the surfaces of the light-generation module 450 and the heat sink 432.

The light-generation module 450 may be configured to be removably secured to the housing heat sink 432. The housing heat sink 432 may define a cavity 433. The cavity 433 may be configured to receive the light-generation module 450. The light-generation module 450 may be configured to be replaced while the housing heat sink 432 remains within the structure. The light-generation module 450 may be removably secured to the housing heat sink 432 using a plurality of fasteners (e.g., screws 436). If the light-generation module 450 malfunctions, the screws 436 may be removed and the light-generation module 450 may be removed from the lighting device assembly 430 and the lighting device 400. A replacement light-generation module 450 may be installed within the lighting device assembly 430 without requiring removal of the lighting device assembly 430 and/or the lighting device 400 from the structure.

Figure 15:
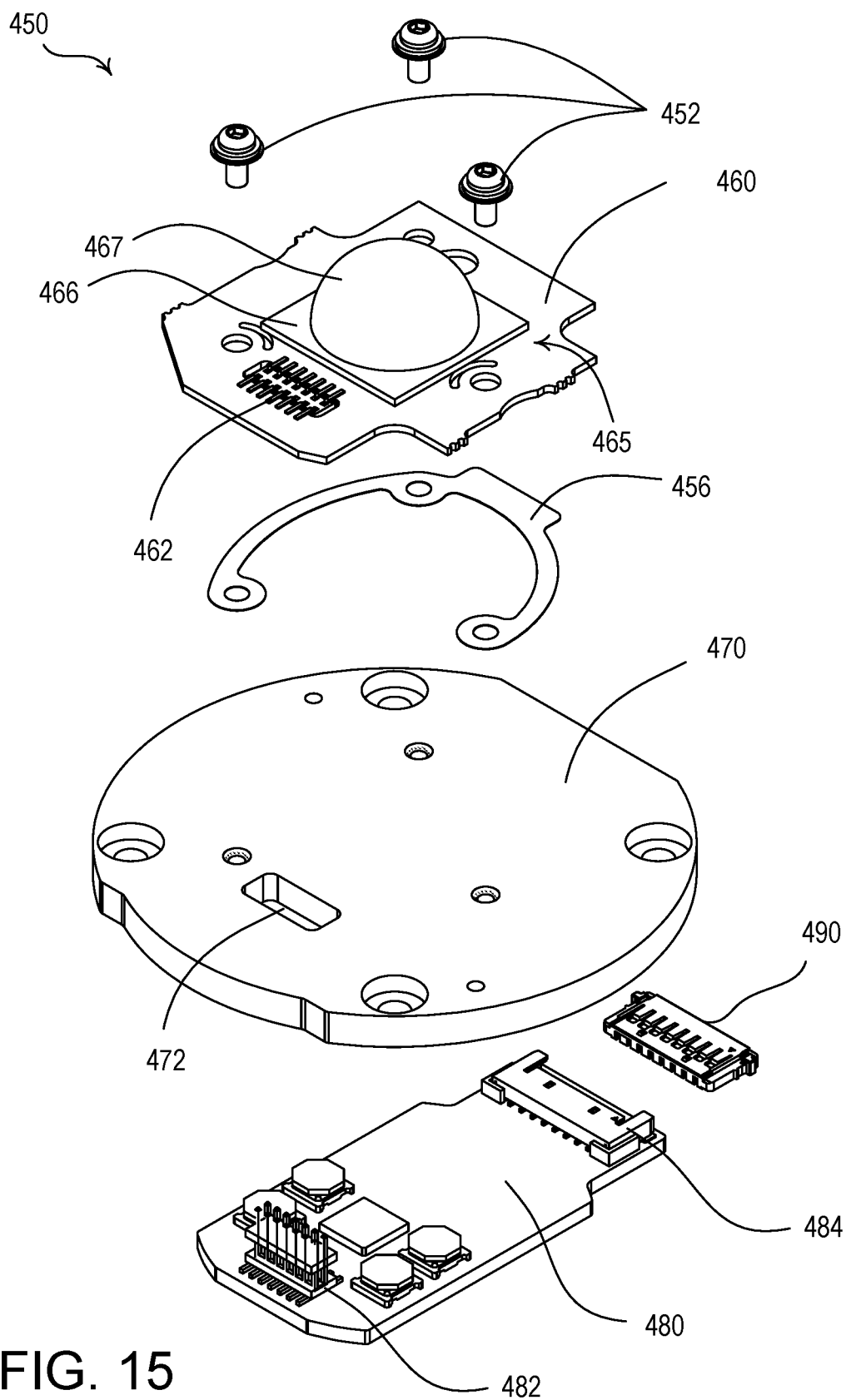
FIG. 15 is a top exploded view of a light-generation module of the lighting device assembly shown in FIG. 14.
Figure 16:
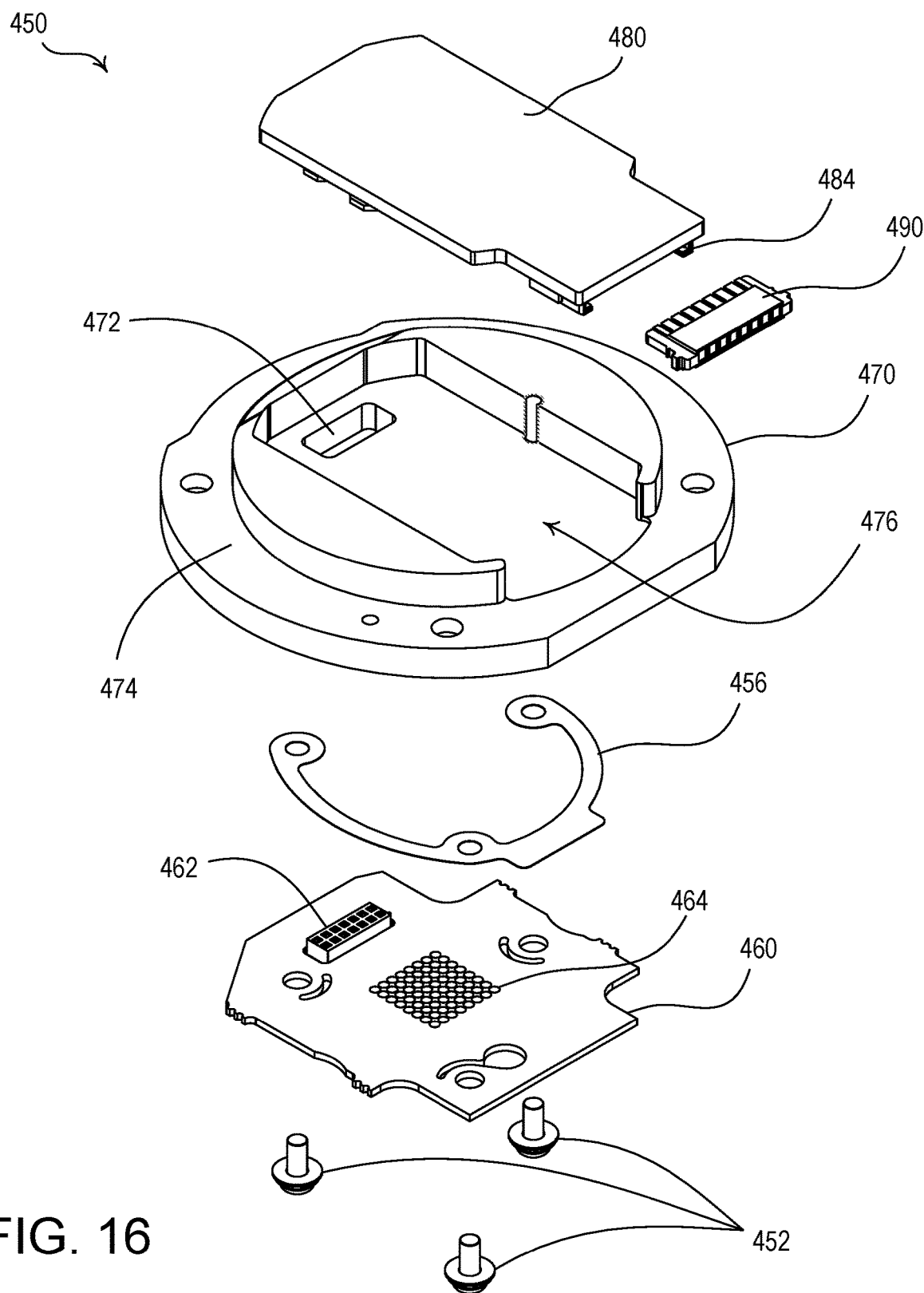
FIG. 16 is a bottom exploded view of the light-generation module shown in FIG. 15.

FIG. 15 is a top exploded view of the light-generation module 450. FIG. 16 is a bottom exploded view of the light-generation module 450. The light-generation module 450 may include a carrier PCB 460, a module heat sink 470, and a control PCB 480. The carrier PCB 460 may include an emitter module 465 (e.g., such as the emitter module 122, the emitter module 200, the emitter module 230, and/or the like) having one or more emitters (e.g., emission LEDs) and/or one or more detectors (e.g., detection LEDs) mounted to a substrate 466. The emitter module 465 may be configured to emit light. The emitter module 465 may include a dome 467 that is configured to enclose the one or more emitters and the one or more detectors. The light-generation module 450 may not include an insulator (e.g., the insulator 180) because the light-generation module 450 of the lighting device 400 is powered by a class-2 DC supply voltage (e.g., the bus voltage $V_{BUS}$ generated by the power supply and control module 420).

The substrate 466 may be a ceramic substrate formed from an aluminum nitride or an aluminum oxide material or some other reflective material, and may function to improve output efficiency of the emitter module 465 by reflecting light out of the emitter module 465 through the dome 467. The dome 467 may include an optically-transmissive material, such as silicon or the like, and may be formed through an over-molding process, for example. A surface of the dome 467 may be textured (e.g., lightly textured), for example, to increase light scattering and promote color mixing, as well as to reflect a portion (e.g., a small amount) of the emitted light back toward the detectors mounted on the substrate 466 (e.g., about 5%).

The control PCB 480 may have electrical circuitry including one or more drive circuits for controlling the amount of power delivered to the emitter LEDs of the emitter module 465, and one or more control circuits for controlling the drive circuits. The carrier PCB 460 may include a carrier PCB connector 462 configured to engage a control PCB connector 482 on the control PCB 480. A thermally-conductive substance 464 (e.g., a plurality of beads of the thermally-conductive substance as shown in FIG. 16) may be disposed between the carrier PCB 460 and the module heat sink 470. A spacer 456 may also be located between the carrier PCB 460 and the module heat sink 470, and a thermally-conductive substance 464 may be located in a void of the spacer 456. The carrier PCB 460 may be connected to the module heat sink 470 via fasteners, such as screws 452. The spacer 456 may operate to relieve stress on the carrier PCB 460 and a substrate 466 of the emitter module 465 as the screws 452 are tightened. For example, if the spacer 456 was not included, the carrier PCB 460 may bend due to the thermally-conductive substance 464 between the carrier PCB 460 and the heat sink 470, which could cause stress on the electrical connections (e.g., solder joints) between the carrier PCB 460 and the substrate 466 of the emitter module 465. The spacer 456 may be integral to the module heat sink 470 (e.g., extending from the front surface of the heat sink 470). The module heat sink 470 may include a shallow recess (not shown) in the front surface in which the thermally-conductive substance 464 may be located (e.g., and the spacer 456 may be omitted).

The control PCB 480 may include the carrier PCB connector 482. The carrier PCB connector 482 may extend through the module heat sink 470 and engage with the control PCB connector 462. The control PCB 480 may include a power supply connector 484. The power supply connector 484 may be configured to connect to a complementary connector 490 of a power supply cable (not shown). The power supply cable may be electrically connected to the power supply and control module 420 for providing the bus voltage $V_{BUS}$ to the control PCB 480. In addition, the power supply cable may provide for communication between the wireless communication circuit of the power supply and control module 420 and the drive circuits on the control PCB 480 to allow for control of the intensity and/or color of the light emitted by the lighting device assembly 430.

The module heat sink 470 may be configured to dissipate heat generated by the emitter module 465. For example, the module heat sink 470 may define a flange 474 that is configured to abut the thermal interface 434. The module heat sink 470 may dissipate the heat to the housing heat sink 432 via the flange 474. The module heat sink 470 may define a recess 476 that is configured to receive the control PCB 480. The control PCB 480 may be secured within the recess 476 of the module heat sink 470. For example, the light generation module 450 may further include a clip (not shown) that is configured to secure the control PCB 480 within the recess 476 of the module heat sink 470. The module heat sink 470 may include an aperture 472. The aperture 472 may receive the carrier PCB connector 482, for example, when the control PCB 480 is received within the recess 476 of the module heat sink 470. For example, the carrier PCB connector 482 may pass through the aperture 472, for example, when connected to the control PCB connector 472. The control PCB connector 472 and the carrier PCB connector 482 may be configured to electrically couple the control PCB 480 and the carrier PCB 460.

Figure 17:
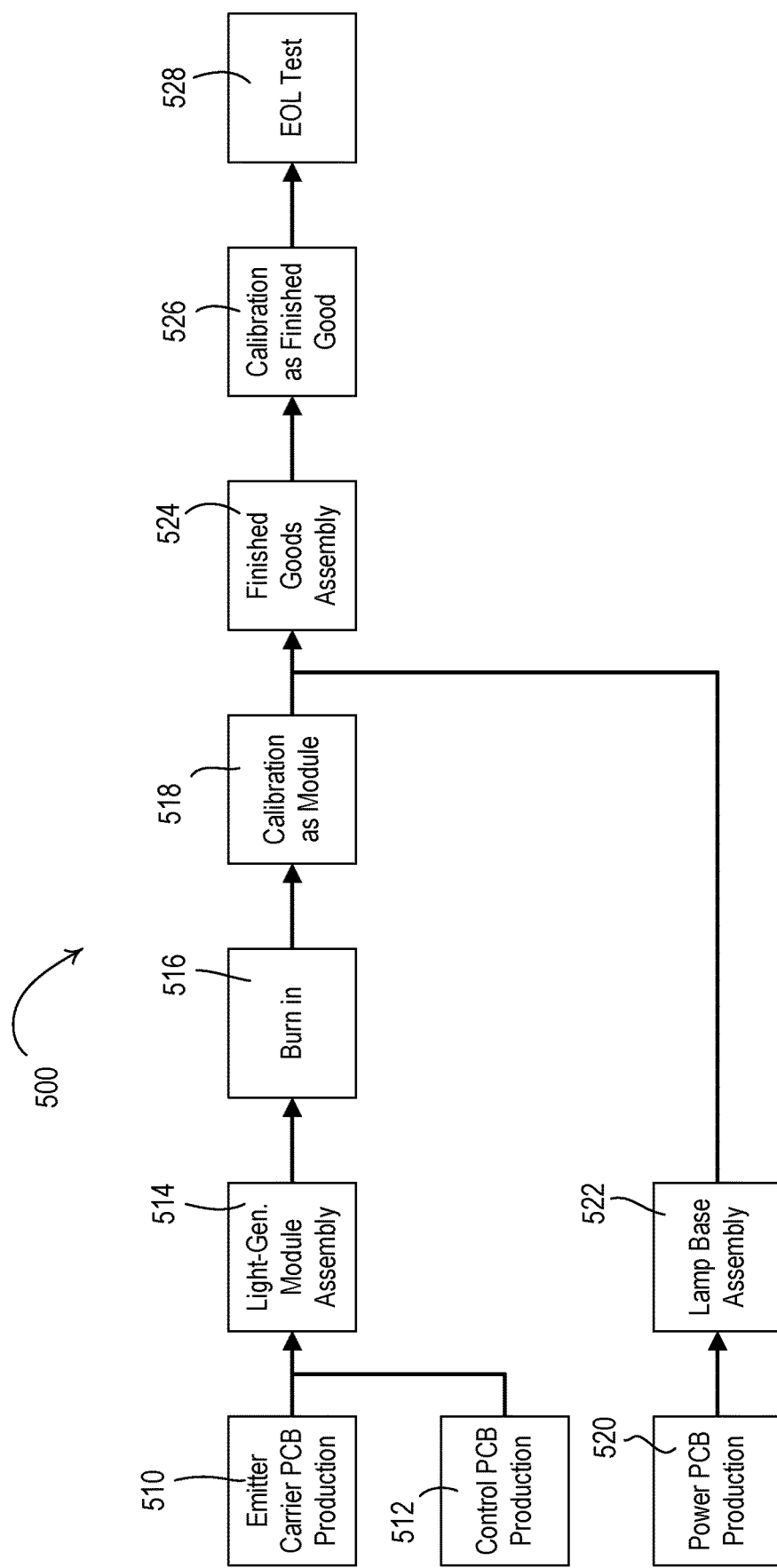
FIG. 17 is a process flow diagram of an example manufacturing process of a lighting device, such as the lighting device of FIG. 1.

FIG. 17 is a process flow diagram of an example manufacturing process 500 of a lighting device, such as the lighting device 100 shown in FIG. 1, the lighting device 300 shown in FIG. 11, and/or the lighting device 400 shown in FIG. 13. An emitter carrier PCB (e.g., the carrier PCB 150 and/or the carrier PCB 460) may be produced at 510, and a control PCB (e.g., the control PCB 160 and/or the control PCB 480) may be produced at 512. For example, electrical components may be placed on and soldered to the emitter carrier PCB and the control PCB at 510 and 512 using standard surface mount technology (SMT) and through-hole technology (THT) techniques, as well as standard soldering techniques. An emitter module (e.g., the emitter module 122, the emitter module 200, and/or the emitter module 465) may be soldered to the carrier PCB at 510. Circuitry including drive circuits, control circuits, and wireless communication circuits, may be mounted and soldered to the control PCB at 512.

At 514, the emitter carrier PCB and the control PCB may be assembled into a light-generation module (e.g., the light-generation module 120 and/or the light-generation module 450). For example, the emitter carrier PCB and the control PCB may be electrically and mechanically connected together with a heat sink (e.g., the module heat sink 170 and/or the module heat sink 470) positioned between the two PCBs at 514. The light-generation module may be a stand-alone module that may be powered (e.g., from a DC power source) and may operate without further assembly. The light-generation module comprises all essential circuits to control the emitter module mounted to the emitter carrier PCB to emit light. At this stage, the light-generation module may be calibrated prior to being assembled into a finished good.

At 516, the light-generation module may execute a burn-in process. The light-generation module may be placed in a configuration jig, which may allow for electrical connection between external equipment and the light-generation module. The light-generation module may be powered through the configuration jig and may be configured to communicate with the external equipment through the configuration jig. During the burn-in process, the light-generation module may be operated for a period of time (e.g., 24 to 48 hours) to stabilize the operation of one or more of the electrical components of the light-generation module. For example, the light-generation module may be operated for the period of time to stabilize the forward voltages of emitters of the emitter module of the light-generation module.

At 518, the light-generation module may be calibrated using a calibration procedure. The light-generation module may remain in the configuration jig during the calibration procedure. During the calibration procedure, calibration values for various operational characteristics of the light-generation module may be stored in memory in the light-generation module. Calibration values may be stored for each of the emitters (e.g., each of the emitter chains) and/or the detectors of the emitter module. For example, calibration values may be stored for measured values of luminous flux (e.g., in lumens), x-chromaticity, y-chromaticity, emitter forward voltage, photodiode current, and detector forward voltage. For example, the luminous flux, x-chromaticity, and y-chromaticity measurements may be obtained from the emitters using an external calibration tool, such as a spectrophotometer. The values for the emitter forward voltages, photodiode currents, and detector forward voltages may be measured internally to the light-generation module. The calibration values for each of the emitters and/or the detectors may be measured at a plurality of different drive currents, e.g., at 100%, 30%, and 10% of a maximum drive current for each respective emitter. In addition, the calibration values for each of the emitters and/or the detectors may be measured at a plurality of different operating temperatures. The light-generation module may be operated in an environment that is controlled to multiple calibration temperatures and values of the operational characteristics may be measured and stored. For example, the light-generation module may be operated at a cold calibration temperature, such as room temperature (e.g., approximately 25° C.), and a hot calibration temperature (e.g., approximately 85° C.). At each temperature, the calibration values for each of the emitters and/or the detectors may be measured at each of the plurality of drive currents and stored in the memory.

Since the light-generation module is not a finished good (e.g., not installed in a housing, such as the housing 110 shown in FIG. 1, the housing heat sink 350 shown in FIG. 11, or the housing heat sink 432 shown in FIG. 14), the configuration jig used during the calibration procedure may have structure that simulates the parts of a potential finished good assembly. For example, the light-generating module may be thermally connected to a representative heat sink, such as, the housing heat sink 112 of the housing 110 that operates as a heat sink. Since the light-generation module may be manufactured in a finished good with various heat sinks, the representative heat sink of the configuration jig may be characterized by average characteristics of the possible heat sinks with which the light-generation module may be installed.

A power PCB (e.g., the power PCB 142 and/or the power PCB 342) may be produced at 520 and a lamp base (e.g., the power converter circuit 140 installed in the base portion 114 and/or the power converter circuit 340 installed in the inner sleeve 330) may be assembled at 522. For example, the electrical components may be placed on and soldered to the emitter carrier PCB and the control PCB at 520 using standard surface mount technology (SMT) and through-hole technology (THT) techniques, as well as standard soldering techniques. The power PCB production at 520 and the lamp base assembly at 522 may be completed separately from the production of the emitter carrier PCB at 510, the production of the control PCB at 512, and the light-generation module assembly at 514.

At 524, a finished good (e.g., a lighting device, such as the lighting device 100 shown in FIG. 1, the lighting device 300 shown in FIG. 11, and/or the lighting device 400 shown in FIG. 13) may be assembled from the light-generation module (e.g., that was calibrated at 518) and the lamp base (e.g., that was assembled at 522). For example, the finished good may include also include a reflector (e.g., the reflector 130 and/or the reflector 370) and a lens (e.g., the lens 115, the upper dome 310, and/or the lens 438). After the finished good is assembled at 524, the lighting device may be calibrated again at 526. For example, the lighting device may be configured to execute a self-calibration procedure to determine a correction factor to use when measuring the luminous flux of the emitters during normal operation. In addition, the lighting device may update one or more of the calibration values stored in the memory as a result of the self-calibration procedure. Additionally or alternatively, the lighting device may determine at 526 one or more compensation factors to use when measuring the luminous flux of the emitters during normal operation based on the type of lens and/or reflector installed in the lighting device. For example, the compensation factors may be transmitted to the lighting device and stored in memory in the lighting device, or may be retrieved from memory in the lighting device. At 528, an end-of-line (EOL) test may be performed to determine if the finished good is operating correctly. The manufacturing process 500 may enable calibration (e.g., at 518) of the light-generation module to be performed in one facility and assembly (e.g., at 524) of the lighting device to be performed in another facility, which may improve supply chain logistics.

Figure 18:
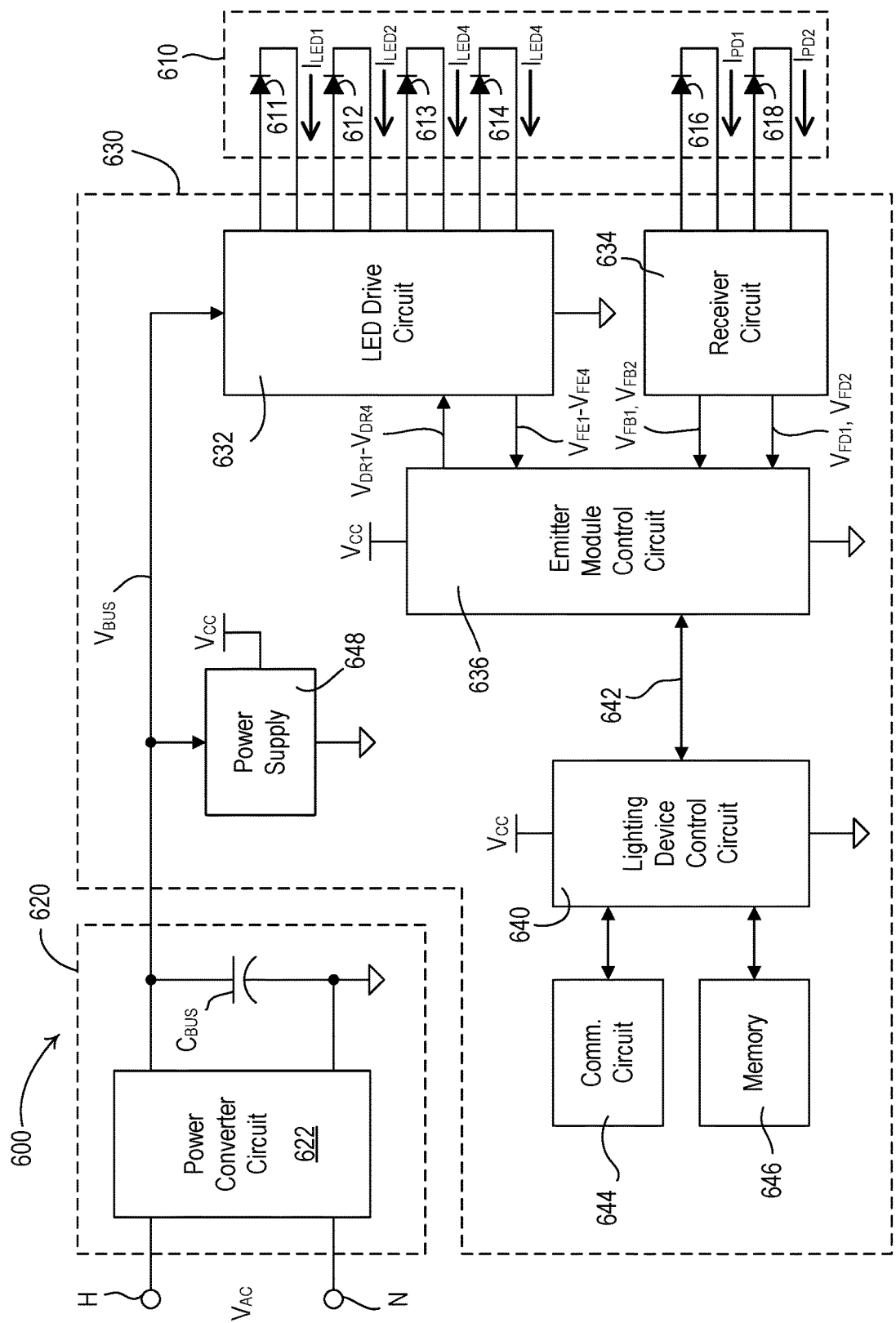
FIG. 18 is a simplified block diagram of an example controllable lighting device, such as the lighting device of FIG. 1.

FIG. 18 is a simplified block diagram of an example controllable electrical device, such as a controllable lighting device 600 (e.g., the lighting device 100 shown in FIG. 1, the lighting device 300 shown in FIG. 11, and/or the lighting device 400 shown in FIG. 13). The controllable lighting device 600 may comprise one or more emitter modules 610 (e.g., the emitter module 200 shown in FIGS. 8 and 9, the emitter module 122 shown in FIG. 3, and/or the emitter module 465 shown in FIG. 15). For example, the controllable lighting device 600 may comprise an emitter module 610 that may include one or more emitters 611, 612, 613, 614. Each of the emitters 611, 612, 613, 614 is shown in FIG. 18 as a single LED, but may each comprise a plurality of LEDs connected in series (e.g., a chain of LEDs), a plurality of LEDs connected in parallel, or a suitable combination thereof, depending on the particular lighting system. In addition, each of the emitters 611, 612, 613, 614 may comprise one or more organic light-emitting diodes (OLEDs). For example, the first emitter 611 may represent a chain of red LEDs, the second emitter 612 may represent a chain of blue LEDs, the third emitter 613 may represent a chain of green LEDs, and the fourth emitter 614 may represent a chain of white or amber LEDs. The emitters 611, 612, 613, 614 may be controlled to adjust a brightness (e.g., a luminous flux or an intensity) and/or a color (e.g., a color temperature) of a cumulative light output of the controllable lighting device 600. The emitter module 610 may also comprise one or more detectors 616, 618 (e.g., photodiodes) that may produce respective photodiode currents $I_{PD1}$, $I_{PD2}$ (e.g., detector signals) in response to incident light. For example, the first detector 616 may represent a single red, orange or yellow LED or multiple red, orange or yellow LEDs in parallel (e.g., the first detectors 212 of the emitter module 200), and the second detector 618 may represent a single green LED or multiple green LEDs in parallel (e.g., the second detectors 214 of the emitter module 200). The emitter module 610 may be mounted on a carrier PCB (e.g., the carrier PCB 150 and/or the carrier PCB 460) of the controllable lighting device 600.

The controllable lighting device 600 may comprise a power-board circuit 620 (e.g., the power converter circuit 140 and/or the power converter circuit 340). The power-board circuit 620 may be mounted to a power PCB (e.g., the power PCB 142 and/or the power PCB 342) of the controllable lighting device 600. The power-board circuit 620 may comprise a power converter circuit 622, which may receive a source voltage, such as an AC mains line voltage $V_{AC}$, via a hot connection H and a neutral connection N (e.g., via the screw-in base 116 and/or the screw-in base 336). The power converter circuit 622 may generate a DC bus voltage $V_{BUS}$ (e.g., approximately 15-20V) across a bus capacitor $C_{BUS}$. The power converter circuit 622 may comprise, for example, a boost converter, a buck converter, a buck-boost converter, a flyback converter, a single-ended primary-inductance converter (SEPIC), a Cuk converter, or any other suitable power converter circuit for generating an appropriate bus voltage. The power converter circuit 622 may provide electrical isolation between the AC power source and the emitters 611, 612, 613, 614, and may operate as a power factor correction (PFC) circuit to adjust the power factor of the controllable lighting device 600 towards a power factor of one.

The controllable lighting device 600 may comprise a control-board circuit 630. The control-board circuit 630 may be mounted to a control PCB (e.g., the control PCB 160) of the controllable lighting device 600. The control-board circuit 630 may comprise an LED drive circuit 632 for controlling (e.g., individually controlling) the power delivered to and the luminous flux of the light emitted of each of the emitters 611, 612, 613, 614 of the emitter module 610. The LED drive circuit 632 may receive the bus voltage $V_{BUS}$ and may adjust magnitudes of respective LED drive currents $I_{LED1}$, $I_{LED2}$, $I_{LED3}$, $I_{LED4}$ conducted through the emitters 611, 612, 613, 614. The LED drive circuit 632 may comprise one or more regulation circuits (e.g., four regulation circuits), such as switching regulators (e.g., buck converters) for controlling the magnitudes of the respective LED drive currents $I_{LED1}$-$I_{LED4}$. An example of the LED drive circuit 632 is described in greater detail in U.S. Pat. No. 9,485,813, issued Nov. 1, 2016, entitled ILLUMINATION DEVICE AND METHOD FOR AVOIDING AN OVER-POWER OR OVER-CURRENT CONDITION IN A POWER CONVERTER, the entire disclosure of which is hereby incorporated by reference.

The control-board circuit 630 may comprise a receiver circuit 634 that may be electrically coupled to the detectors 616, 618 of the emitter module 610 for generating respective optical feedback signals $V_{FB1}$, $V_{FB2}$ in response to the photodiode currents $I_{PD1}$, $I_{PD2}$. The receiver circuit 634 may comprise one or more trans-impedance amplifiers (e.g., two trans-impedance amplifiers) for converting the respective photodiode currents $I_{PD1}$, $I_{PD2}$ into the optical feedback signals $V_{FB1}$, $V_{FB2}$. For example, the optical feedback signals $V_{FB1}$, $V_{FB2}$ may have DC magnitudes that indicate the magnitudes of the respective photodiode currents $I_{PD1}$, $I_{PD2}$.

The control-board circuit 630 may comprise an emitter module control circuit 636 for controlling the LED drive circuit 632 to control the intensities of the emitters 611, 612, 613, 614 of the emitter module 610. The emitter module control circuit 636 may comprise, for example, a microprocessor, a microcontroller, a programmable logic device (PLD), an application specific integrated circuit (ASIC), a field-programmable gate array (FPGA), or any other suitable processing device or controller. The emitter module control circuit 636 may generate one or more drive signals $V_{DR1}$, $V_{DR2}$, $V_{DR3}$, $V_{DR4}$ for controlling the respective regulation circuits in the LED drive circuit 632. The emitter module control circuit 636 may receive the optical feedback signals $V_{FB1}$, $V_{FB2}$ from the receiver circuit 634 for determining the luminous flux LE of the light emitted by the emitters 611, 612, 613, 614.

The emitter module control circuit 636 may receive a plurality of emitter forward-voltage feedback signals $V_{FE1}$, $V_{FE2}$, $V_{FE3}$, $V_{FE4}$ from the LED drive circuit 632 and a plurality of detector forward-voltage feedback signals $V_{FD1}$, $V_{FD2}$ from the receiver circuit 634. The emitter forward-voltage feedback signals $V_{FE1}$-$V_{FE4}$ may be representative of the magnitudes of the forward voltages of the respective emitters 611, 612, 613, 614, which may indicate temperatures $T_{E1}$, $T_{E2}$, $T_{E3}$, $T_{E4}$ of the respective emitters. If each emitter 611, 612, 613, 614 comprises multiple LEDs electrically coupled in series, the emitter forward-voltage feedback signals $V_{FE1}$-$V_{FE4}$ may be representative of the magnitude of the forward voltage across a single one of the LEDs or the cumulative forward voltage developed across multiple LEDs in the chain (e.g., all of the series-coupled LEDs in the chain). The detector forward-voltage feedback signals $V_{FD1}$, $V_{FD2}$ may be representative of the magnitudes of the forward voltages of the respective detectors 616, 618, which may indicate temperatures $T_{D1}$, $T_{D2}$ of the respective detectors. For example, the detector forward-voltage feedback signals $V_{FD1}$, $V_{FD2}$ may be equal to the forward voltages $V_{FD}$ of the respective detectors 616, 618.

The controllable lighting device 600 may comprise a lighting device control circuit 640 that may be electrically coupled to the emitter module control circuit 636 via a communication bus 642 (e.g., an I²C communication bus). The lighting device control circuit 640 may be configured to control the emitter module 610 to control the brightness (e.g., the luminous flux) and/or the color (e.g., the color temperature) of the cumulative light emitted by the controllable lighting device 600. The lighting device control circuit 640 may comprise, for example, a microprocessor, a microcontroller, a programmable logic device (PLD), an application specific integrated circuit (ASIC), a field-programmable gate array (FPGA), or any other suitable processing device or controller. The lighting device control circuit 640 may be configured to adjust (e.g., dim) a present intensity $L_{PRES}$ (e.g., a present brightness) of the cumulative light emitted by the controllable lighting device 600 towards a target intensity $L_{TRGT}$ (e.g., a target brightness), which may range across a dimming range of the controllable lighting device, e.g., between a low-end intensity $L_{LE}$ (e.g., a minimum intensity, such as approximately 0.1%-1.0%) and a high-end intensity $L_{HE}$ (e.g., a maximum intensity, such as approximately 100%). The lighting device control circuit 640 may be configured to adjust a present color temperature $T_{PRES}$ of the cumulative light emitted by the controllable lighting device 600 towards a target color temperature $T_{TRGT}$, which may range between a cool-white color temperature (e.g., approximately 3100-4500 K) and a warm-white color temperature (e.g., approximately 2000-3000 K).

The controllable lighting device 600 may comprise a communication circuit 644 coupled to the lighting device control circuit 640. The communication circuit 644 may comprise a wireless communication circuit, such as, for example, a radio-frequency (RF) transceiver coupled to an antenna for transmitting and/or receiving RF signals. The wireless communication circuit may be an RF transmitter for transmitting RF signals, an RF receiver for receiving RF signals, or an infrared (IR) transmitter and/or receiver for transmitting and/or receiving IR signals. The communication circuit 644 may be coupled to the hot connection H and the neutral connection N of the controllable lighting device 600 for transmitting a control signal via the electrical wiring using, for example, a power-line carrier (PLC) communication technique. The lighting device control circuit 640 may be configured to determine the target intensity $L_{TRGT}$ for the controllable lighting device 600 in response to messages (e.g., digital messages) received via the communication circuit 634.

The controllable lighting device 600 may comprise a memory 646 configured to store operational characteristics of the controllable lighting device 600 (e.g., the target intensity $L_{TRGT}$, the target color temperature $T_{TRGT}$, the low-end intensity $L_{LE}$, the high-end intensity $L_{HE}$, etc.). The memory may be implemented as an external integrated circuit (IC) or as an internal circuit of the lighting device control circuit 640. The controllable lighting device 600 may comprise a power supply 648 that may receive the bus voltage $V_{BUS}$ and generate a supply voltage $V_{CC}$ for powering the lighting device control circuit 640 and other low-voltage circuitry of the controllable lighting device.

When the controllable lighting device 600 is on, the light source control circuit 640 may be configured to control the emitter modules 610 to emit light substantially all of the time. The lighting device control circuit 640 may be configured to control the emitter modules 610 to disrupt the normal emission of light to measure one or more operational characteristics of the emitter modules during periodic measurement intervals. For example, during the measurement intervals, the emitter module control circuit 636 may be configured to individually turn on each of the different-colored emitters 611, 612, 613, 614 of the emitter modules 610 (e.g., while turning of the other emitters) and measure the luminous flux of the light emitted by that emitter using one of the two detectors 616, 618. For example, the emitter module control circuit 636 may turn on the first emitter 611 of the emitter module 610 (e.g., at the same time as turning off the other emitters 612, 613, 614 and determine the luminous flux LE of the light emitted by the first emitter 611 in response to the first optical feedback signal $V_{FB1}$ generated from the first detector 616. In addition, the emitter module control circuit 636 may be configured to drive the emitters 611, 612, 613, 614 and the detectors 616, 618 to generate the emitter forward-voltage feedback signals $V_{FE1}$-$V_{FE4}$ and the detector forward-voltage feedback signals $V_{FD1}$, $V_{FD2}$ during the measurement intervals.

Methods of measuring the operational characteristics of emitter modules in a lighting device are described in greater detail in U.S. Pat. No. 9,332,598, issued May 3, 2016, entitled INTERFERENCE-RESISTANT COMPENSATION FOR ILLUMINATION DEVICES HAVING MULTIPLE EMITTER MODULES; U.S. Pat. No. 9,392,660, issued Jul. 12, 2016, entitled LED ILLUMINATION DEVICE AND CALIBRATION METHOD FOR ACCURATELY CHARACTERIZING THE EMISSION LEDS AND PHOTODETECTOR(S) INCLUDED WITHIN THE LED ILLUMINATION DEVICE; and U.S. Pat. No. 9,392,663, issued Jul. 12, 2016, entitled ILLUMINATION DEVICE AND METHOD FOR CONTROLLING AN ILLUMINATION DEVICE OVER CHANGES IN DRIVE CURRENT AND TEMPERATURE, the entire disclosures of which are hereby incorporated by reference.

Calibration values for the various operational characteristics of the controllable lighting device 600 may be stored in the memory 646 as part of a calibration procedure performed during manufacturing of the controllable lighting device 600. Calibration values may be stored for each of the emitters 611, 612, 613, 614 and/or the detectors 616, 618 of each of the emitter modules 610. For example, calibration values may be stored for measured values of luminous flux (e.g., in lumens), x-chromaticity, y-chromaticity, emitter forward voltage, photodiode current, and detector forward voltage. For example, the luminous flux, x-chromaticity, and y-chromaticity measurements may be obtained from the emitters 611, 612, 613, 614 using an external calibration tool, such as a spectrophotometer. The values for the emitter forward voltages, photodiode currents, and detector forward voltages may be measured internally to the controllable lighting device 600. The calibration values for each of the emitters 611, 612, 613, 614 and/or the detectors 616, 618 may be measured at a plurality of different drive currents, and/or at a plurality of different operating temperatures.

After installation, the lighting device control circuit 640 of the controllable lighting device 600 may use the calibration values stored in the memory 646 to maintain a constant light output from the emitter modules 610. The lighting device control circuit 640 may determine target values for the luminous flux to be emitted from the emitters 611, 612, 613, 614 to achieve the target intensity $L_{TRGT}$ and/or the target color temperature $T_{TRGT}$ for the controllable lighting device 600. The lighting device control circuit 640 may determine the magnitudes for the respective drive currents $I_{LED1}$-$I_{LED4}$. for the emitters 611, 612, 613, 614 based on the determined target values for the luminous flux to be emitted from the emitters 611, 612, 613, 614. When the age of the controllable lighting device 600 is zero, the magnitudes of the respective drive currents $I_{LED1}$-$I_{LED4}$ for the emitters 611, 612, 613, 614 may be controlled to initial magnitudes LED-INITIAL.

The light output of the emitter modules 610 may decrease as the emitters 611, 612, 613, 614 age. The lighting device control circuit 640 may be configured to increase the magnitudes of the drive current IDR for the emitters 611, 612, 613, 614 to adjusted magnitudes LED-ADJUSTED to achieve the determined target values for the luminous flux of the target intensity $L_{TRGT}$ and/or the target color temperature $T_{TRGT}$. Methods of adjusting the drive currents of emitters to achieve a constant light output as the emitters age are described in greater detail in U.S. Pat. No. 9,769,899, issued Sep. 19, 2017, entitled ILLUMINATION DEVICE AND AGE COMPENSATION METHOD, the entire disclosure of which is hereby incorporated by reference.

As shown in FIG. 18, the electrical circuitry of the control-board circuit 630 may comprise the LED drive circuit 632, the receiver circuit 634, the emitter module control circuit 636, the lighting device control circuit 640, the communication circuit 644, the memory 646, and the power supply 648 (e.g., as is the case for the electrical circuitry mounted to the control PCB 160 of the light-generation module 120 of the lighting device 100 and/or the lighting device 300). However, for the lighting device 400 shown in FIG. 14, the electrical circuitry mounted to the control PCB 480 of the light-generation module 450 may comprise just the LED drive circuit 632, the receiver circuit 634, and the emitter module control circuit 636. The power supply and control module 420 of the lighting device 400 may comprise the power converter circuit 622, the lighting device control circuit 640, and the communication circuit 644. The LED drive circuit 632 may be configured to receive the bus voltage $V_{BUS}$ via the cable connected to the connector 490, and/or the emitter module control circuit 636 may be configured to communicate with the lighting device control circuit 640 via the cable connected to the connector 490 (e.g., the communication bus 642 may be implemented via the cable connected to the connector 490). In addition, the electrical circuitry of the control PCB 480 of the light-generation module 450 and/or the electrical circuitry of the power supply and control module 420 may each include a memory (e.g., the memory 646) and/or a power supply (e.g., the power supply 648).

What is claimed is:

1. A lighting device comprising:
   a light-generation module comprising:
      an emitter mounted to a substrate and configured to emit light;
      a first printed circuit board to which the substrate is mounted;
      a second printed circuit board comprising a drive circuit for the emitter, a control circuit for controlling the drive circuit, and a wireless communication circuit configured to communicate wireless control signals;
      an antenna that extends from the second printed circuit board, the antenna electrically coupled to the wireless communication circuit on the second printed circuit board; and
      a heat sink located between the first printed circuit board and the second printed circuit board, the emitter thermally-coupled to the heat sink through the substrate and the first printed circuit board;
   a lens through which the light from the emitter is conducted; and
   a reflector configured to reflect light emitted by the emitter towards the lens,
   wherein the lens, the reflector, and the first printed circuit board of the light-generation module define an optical cavity, and wherein the antenna extends through the heat sink into the optical cavity.

2. The lighting device of claim 1, wherein the antenna extends through a tunnel in the heat sink and an opening in the first printed circuit board.

3. The lighting device of claim 2, wherein the light-generation module comprises an insulator configured to be received in a first recess in a rear surface of the heat sink, the insulator configured to electrically isolate the drive circuit, the control circuit, and the wireless communication circuit from the heat sink.

4. The lighting device of claim 3, wherein the insulator comprises a second recess in which the second printed circuit board is located.

5. The lighting device of claim 4, wherein the heat sink comprises a coupling portion configured to be capacitively coupled to a ground plane of the second printed circuit board when the second printed circuit board is located in the second recess of the insulator.

6. The lighting device of claim 5, wherein the insulator comprises a void through which the coupling portion of the heat sink extends towards the second printed circuit board.

7. The lighting device of claim 6, wherein the light-generation module further comprises an insulating material located between the coupling portion of the heat sink and the second printed circuit board.

8. The lighting device of claim 5, wherein the heat sink operates as a counterpoise for the antenna.

9. The lighting device of claim 4, wherein the first printed circuit board comprises a first connector configured to be connected to a second connector of the second printed circuit board for electrically coupling the drive circuit to the emitter.

10. The lighting device of claim 9, wherein at least one of the first and second connectors extend through respective openings in the heat sink and the insulator.

11. The lighting device of claim 10, wherein the insulator comprises an extension that defines a bore therethrough and is received in the tunnel, and wherein the antenna is received through the bore of the extension and the extension is configured to electrically isolate the antenna from the first printed circuit board.

12. The lighting device of claim 11, further comprising:
a shield located over a top surface of the first printed circuit board in the optical cavity, the shield configured to be electrically coupled to the heat sink to reduce noise from the second printed circuit board from coupling to the reflector of the lighting device.

13. The lighting device of claim 12, wherein a top side of the shield is electrically coupled to the heat sink, and a bottom side of the shield is not electrically conductive such that the first printed circuit board is electrically isolated from the shield.

14. The lighting device of claim 12, wherein the antenna is a plated wire.

15. The lighting device of claim 12, wherein the antenna comprises a bent portion so as to avoid contacting an inner surface of the lens of the lighting device.

16. The lighting device of claim 12, wherein the antenna is straight and a distal portion of the antenna is configured to abut an inner surface of the lens.

17. The lighting device of claim 1, wherein a bottom surface of the substrate comprises:
a plurality of electrical pads grouped together in sets of multiple pads, the electrical pads coupled to corresponding electrical pads on a top side of the first printed circuit board; and
one or more heat sink pads, the heat sink pads comprising a central pad and four corner pads located in respective corners of the substrate.

18. The lighting device of claim 17, wherein at least one of the sets of electrical pads on the bottom surface of the substrate is surrounded by an electrostatic discharge trace that is connected to a ground plane of the first printed circuit board.

19. The lighting device of claim 1, further comprising:
a housing defining a cavity in which light-generation module is located, the heat sink thermally coupled to the housing,
wherein the heat sink is configured to radiate heat generated by the emitter radially out through the sidewall to the housing.

* * * * *